(12) United States Patent
Yang et al.

(10) Patent No.: US 7,427,734 B2
(45) Date of Patent: Sep. 23, 2008

(54) MULTIPLE PHOTOSENSOR PIXEL

(75) Inventors: Guang Yang, Annandale, NJ (US);
Taner Dosluoglu, New York, NY (US)

(73) Assignee: Digital Imaging Systems GmbH,
Kirchheim/Teck-Nabern (DE)

( * ) Notice: Subject to any disclaimer, the term of this patent is extended or adjusted under 35 U.S.C. 154(b) by 92 days.

(21) Appl. No.: 11/252,840

(22) Filed: Oct. 18, 2005

(65) Prior Publication Data

US 2007/0084986 A1 Apr. 19, 2007

(51) Int. Cl.
*H01L 27/00* (2006.01)

(52) U.S. Cl. .............. 250/208.1; 250/214 R; 250/226; 348/280; 257/291

(58) Field of Classification Search .......... 250/208.1, 250/214 R, 226; 348/280, 300–302; 257/257, 257/258, 291, 292, 293, 294
See application file for complete search history.

(56) References Cited

U.S. PATENT DOCUMENTS

| | | | |
|---|---|---|---|
| 3,971,065 A | 7/1976 | Bayer | 358/41 |
| 5,028,970 A | 7/1991 | Masatoshi | 357/30 |
| 5,898,168 A * | 4/1999 | Gowda et al. | 250/208.1 |
| 6,111,300 A | 8/2000 | Cao et al. | 257/440 |
| 6,455,833 B1 * | 9/2002 | Berezin | 250/208.1 |
| 6,486,911 B1 | 11/2002 | Denyer et al. | 348/308 |
| 6,693,670 B1 | 2/2004 | Stark | 348/308 |
| 6,714,239 B2 * | 3/2004 | Guidash | 348/223.1 |
| 6,903,754 B2 | 6/2005 | Brown Elliott | 345/694 |
| 7,087,883 B2 * | 8/2006 | He et al. | 250/214 R |
| 7,105,793 B2 * | 9/2006 | Rhodes | 250/208.1 |
| 7,244,918 B2 * | 7/2007 | McKee et al. | 250/208.1 |
| 2005/0051702 A1 * | 3/2005 | Hong et al. | 250/214.1 |
| 2006/0256221 A1 * | 11/2006 | Mckee et al. | 348/308 |
| 2007/0040922 A1 * | 2/2007 | McKee et al. | 348/308 |

OTHER PUBLICATIONS

"A CMOS Image Sensor With a Double-Junction Active Pixel", by Findlater et al., IEEE Trans-on Electron Devices, vol. 50, No. 1, Jan. 2003, pp. 32-42.
"Photodiode Characteristics and Applications", Product Catalog (2003), UDT Sensors, Inc. Hawthorne, CA 90250, Found www.udt.com, Sep. 5. 2005.
Co-pending U.S. Patent DS-14452, U.S. Appl. No. 10/813,864, filed Mar. 31, 2004, "Red/Green Pixel With Simultaneous Exposure and Improved MTF", Assigned to the Same Asignee.

* cited by examiner

*Primary Examiner*—Stephen Yam
(74) *Attorney, Agent, or Firm*—Saile Ackerman LLC; Stephen B. Ackerman; Billy Knowles

(57) ABSTRACT

A multiple photosensor pixel image sensor sense differentiated color components of light. The multiple photosensor pixel image sensor has a plurality of photo-sensing devices formed with the surface of the substrate. Each photo-sensing device has a structure adjusted to convert photons of the light to photoelectrons representative of a magnitude of the color component of the light for which the structure of the photo-sensing device is adjusted. Each multiple photosensor pixel image sensor includes at least one storage node to selectively receive photoelectrons from each photo-sensing device and triggering switches connected to selectively and sequentially transfer the photoelectrons from each of the plurality of photo-sensing devices to the storage node. At least one reset triggering switch is connected to the one storage node to place the storage node to a reset voltage level after integration and sensing of the photoelectrons.

71 Claims, 15 Drawing Sheets

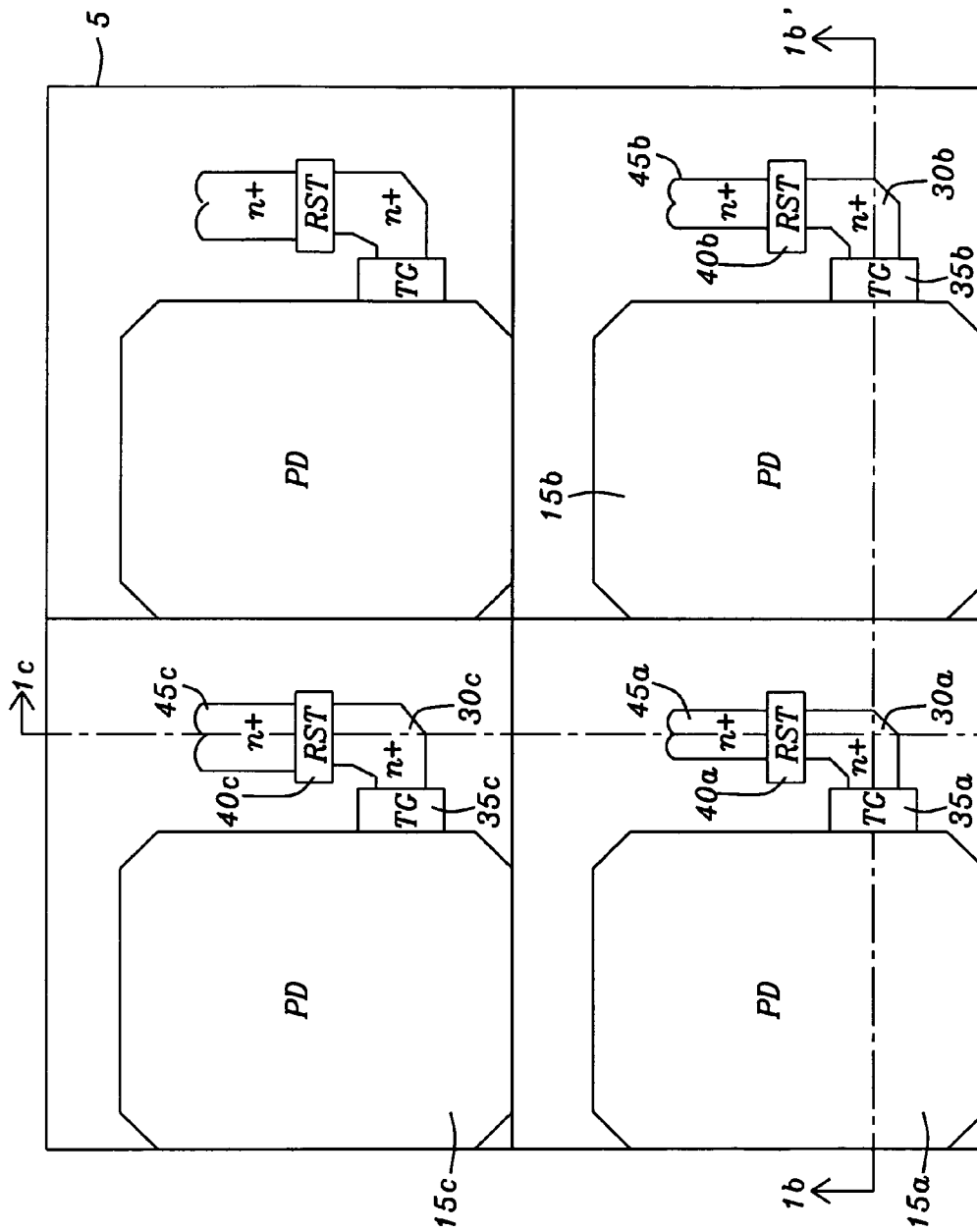
FIG. 1a – Prior Art

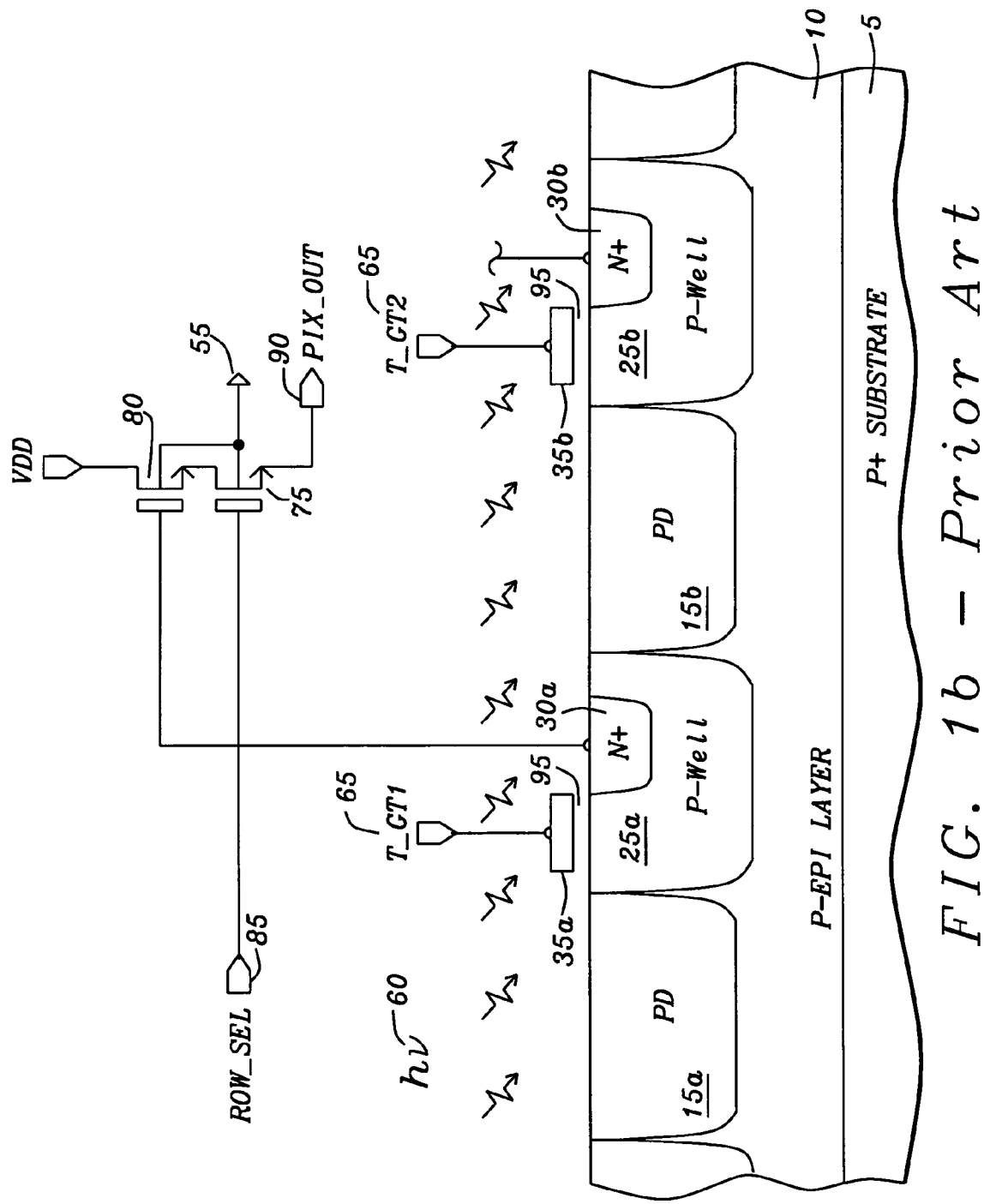
FIG. 1b – Prior Art

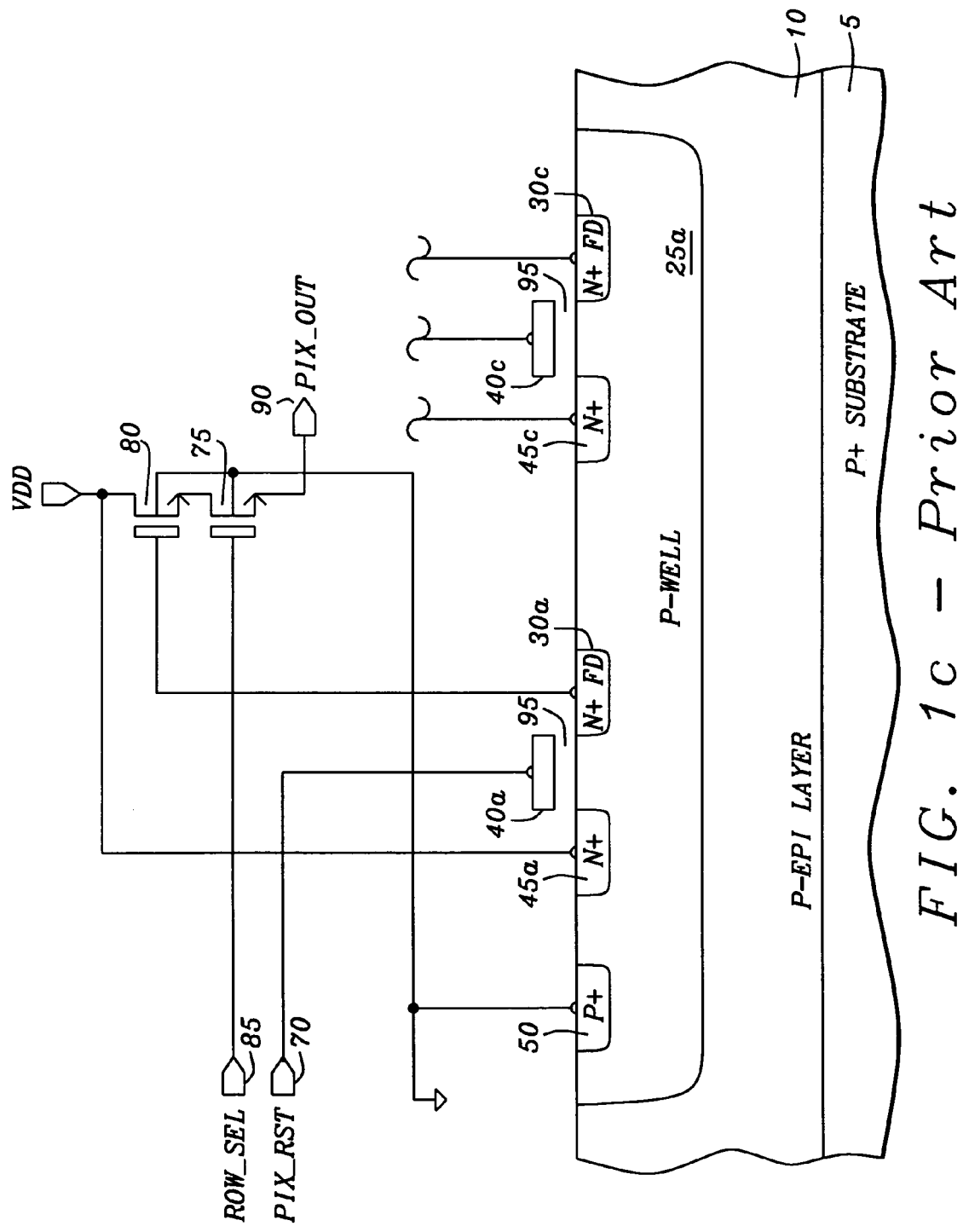
FIG. 1c – Prior Art

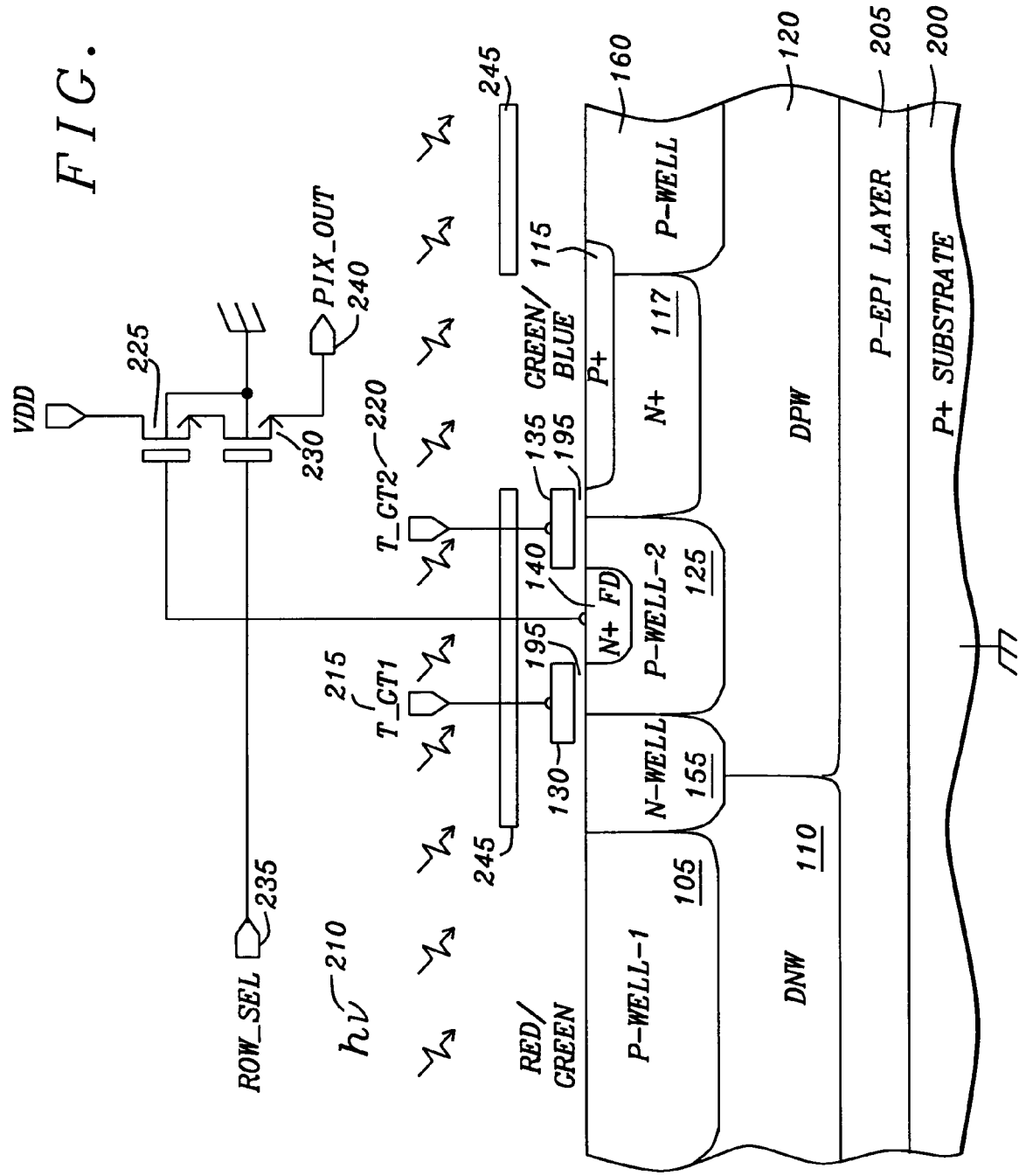

MULTIPLE PHOTOSENSOR PIXEL

BACKGROUND OF THE INVENTION

1. Field of the Invention

The present invention relates to solid-state image sensing devices, methods for fabricating solid state image sensing devices and an image capture system using the same.

2. Description of Related Art

Integrated circuit image sensors are finding applications in a wide variety of fields, including machine vision, robotics, guidance and navigation, automotive applications, and consumer products such as digital camera and video recorders. Imaging circuits typically include a two dimensional array of photo sensors. Each photo sensor includes one picture element (pixel) of the image. Light energy emitted or reflected from an object impinges upon the array of photo sensors. The light energy is converted by the photo sensors to an electrical signal. Imaging circuitry scans the individual photo sensors to readout the electrical signals. The electrical signals of the image are processed by external circuitry for subsequent display.

Modern metal oxide semiconductor (MOS) design and processing techniques have been developed that provide for the capture of light as charge and the transporting of that charge within active pixel sensors and other structures so as to be accomplished with almost perfect efficiency and accuracy.

One class of solid-state image sensors includes an array of active pixel sensors (APS). An APS is a light sensing device with sensing circuitry inside each pixel. Each active pixel sensor includes a sensing element formed in a semiconductor substrate and capable of converting photons of light into electronic signals. As the photons of light strike the surface of a photoactive region of the solid-state image sensors, free charge carriers are generated and collected. Once collected the charge carriers, often referred to as charge packets or photoelectrons are transferred to output circuitry for processing.

An active pixel sensor also includes one or more active transistors within the pixel itself. The active transistors amplify and buffer the signals generated by the light sensing element to convert the photoelectron to an electronic signal prior to transferring the signal to a common conductor that conducts the signals to an output node.

Active pixel sensor devices are fabricated using processes that are consistent with complementary metal oxide semiconductor (CMOS) processes. Using standard CMOS processes allows many signal processing functions and operation controls to be integrated with an array of active pixel sensors on a single integrated circuit chip.

Refer now to FIGS. 1a-1c for a more detailed discussion of a pinned photodiode active pixel image sensor of the prior art. A substrate 5 heavily doped with a P-type impurity has its surface further doped with a complementary impurity to create a lightly doped P-type epitaxial layer 10. The photo detector regions 15a, 15b, and 15c are formed within the surface of the epitaxial layer 10 of the substrate 5. A P-type material is heavily diffused relatively deeply into the surface of the epitaxial layer 10 of the substrate 5 to form the P-well diffusions 25a and 25b. A P-type material is diffused into the surface of the substrate 5 to form the contact diffusions 50 for the P-well diffusions 25a.

A gate insulator or thin oxide 95 is placed on the surface of the substrate 5 and polycrystalline silicon is formed on the surface to form the transfer gates 35a, 35b, and 35c and the reset gates 40a, 40b, and 40c. An N-type material is heavily diffused into the surface of the P-well diffusions 25a and 25b of the substrate 5 to form the floating diffusions 30a, 30b, and 30c and the N⁺ source/drain regions 45a, 45b, and 45c. The photo detector regions 15a, 15b, and 15c, the transfer gates 35a, 35b, and 35c, and the floating diffusions 30a, 30b, and 30c are transfer gate switches. The floating diffusions 30a, 30b, and 30c, reset gates 40a, 40b, and 40c and N⁺ source/drain regions 45a, 45b, and 45c form the reset gate switch.

The transfer gates 35a, 35b, and 35c of the transfer gate switches are connected to a transfer gating signals T_GT 65 and the reset gates 20a, 20b, and 20c of the reset gate switches are connected to the pixel reset signal PIX_RST 70. The N⁺ source/drain regions 45a, 45b, and 45c are connected to a power supply voltage source VDD. The floating diffusion 30a is connected to the gate of the CMOS transistor 80. The drain of the CMOS transistor 80 is connected to the power supply voltage source VDD and the emitter of the CMOS transistor 80 is connected to the drain of the CMOS transistor 75. The gate of the CMOS transistor 75 is connected to the row select signal 85. The CMOS transistor 75 acts as a source follower to buffer the electrical signal created by the photoelectron charge collected in the floating diffusion 30a.

The photons that impinge upon the photo detector 15a are converted to photoelectrons and collected within the photo detector 15a. At the completion of an integration of the collection of the photoelectrons, the transfer gate 35a is activated to turn on the transfer gate switch to transfer the collected photoelectrons to the storage node of the floating diffusion 30a. When the collected photoelectrons are retained at the floating diffusion 30a the row select signal 85 is activated to turn on the transistor 75 to gate the pixel output electrical signal PIX_OUT 90 to external circuitry for processing and display. The amplitude of pixel output electrical signal PIX_OUT 90 is indicative of the intensity of the light energy hv or the number of photons 60 absorbed by the pinned photodiode. Once the pixel output electrical signal PIX_OUT 90 is read out the pixel reset signal 70 is activated to turn on the reset gate switch and the photo detector region 15a and the floating diffusion storage node 30a are emptied of the photoelectrons.

As is known in the art, a video display is formed of an array of picture elements or pixels. A pixel is one of the smallest complete elemental dots that make up the representation of a picture on a display. Usually the dots are so small and so numerous they appear to merge into a smooth image. The color and intensity of each dot is variable. In color displays the pixels are formed of red, green, and blue sub-pixels that are of a size and arrangement that light emitting from them is added to form the color of the whole pixel. Pixels are either rectangular or square.

U.S. Pat. No. 6,903,754 (Brown-Elliott) teaches an arrangement of color pixels for full color imaging devices with simplified addressing referred to as the Pentile Matrix. The architecture of the array consists of an array of rows and column line architecture for a display. The array consists of a plurality of row and column positions and a plurality of three-color pixel elements. A three-color pixel element can comprise a blue emitter, a pair of red emitters, and a pair of green emitters. The blue emitter is placed in the center of a square formed of the pairs of red and green emitters. The pair of red emitters are on opposing corners of the square and the pair of green emitters are adjacent to the red emitters and the other opposing corners of the square.

Image sensors (either CMOS or Charged Coupled Devices) often employ color filter arrays to generate the color components that are to be displayed. The color filter arrays, such as the Bayer Pattern as shown in U.S. Pat. No. 3,971,065

(Bayer), provide the color information or an image. However, this information must be reformatted to match the sub-pixel arrangement of a display.

"A CMOS Image Sensor with a Double-Junction Active Pixel", Findlater, et al., IEEE Transactions on Electron Devices, January 2003, Vol.: 50, Issue: 1, pp.: 32-42, describes a CMOS image sensor that employs a vertically integrated double-junction photodiode structure. The imager allows color imaging with only two filters. The sensor uses a 6-transistor pixel array.

U.S. Pat. No. 5,028,970 (Masatoshi) provides an image sensor for sequentially reading signals from photoelectric converting elements disposed in a matrix and formed on a substrate in which both an image sensor and a photometry sensor are incorporated. The sensor includes a light-shielding layer disposed over the area of the substrate except the area of the photoelectric elements, the light-shielding layer forming a lower electrode. A PN-junction photodiode layer is disposed over the light-shielding layer, and an upper transparent electrode layer is disposed at least over the photodiode layer. The upper transparent electrode layer is divided into a plurality of pattern areas. If desired, at least one of the pattern areas of the upper transparent electrode layer may be further divided into a plurality of very small areas and color filters formed over the very small areas.

U.S. Pat. No. 6,111,300 (Cao, et al.) teaches a multiple color detection elevated pin photodiode active pixel sensor formed on a substrate. A diode is electrically connected to a first doped region of the substrate. The diode conducts charge when the diode receives photons having a first range of wavelengths. A second doped region conducts charge when receiving photons having a second range of wavelengths. The photons having the second range of wavelengths pass through the diode substantially undetected by the diode. A doped well within the substrate conducts charge when receiving photons having a third range of wavelengths. The photons having the third range of wavelengths pass through the diode substantially undetected by the diode.

U.S. Pat. No. 6,486,911 (Denyer, et al.) describes an optoelectronic sensor with shuffled readout. The optoelectronic sensor is a multi-spectral image array sensor that senses radiation of different wavelengths e.g. different colors. The array has at least one row of cells containing a plurality of series (R,G) of pixels which series are interspersed with each other. Each series consists essentially of pixels for sensing radiation of substantially the same wavelength e.g. the same color. At least two horizontal shift registers are provided each register being coupled to pixels of a respective one of the plurality of series (R,G) of pixels so as to enable the outputs from the pixels of each series to be read out consecutively at an array output. The pixels are preferably arranged in a Bayer matrix of Red, Green and Blue pixels and two interleaved shift registers are provided for reading out the pixel outputs for each color consecutively, in each row.

U.S. Pat. No. 6,693,670 (Stark) provides a multi-photodetector unit cell, which includes a plurality of light-detecting unit cells and a single charge-integration and readout circuitry. Typically, each of the cells produces charge representative of the detected light. The integration and readout circuit may be shared by the plurality of unit cells, and used to read-out the charge in real-time. The cluster may also include a switch associated with each unit cell, such that each switch connects its associated unit cell to the circuit. Each unit cell includes a photodetector, a photodiode or a photogate. The circuit includes a shared storage device, a shared reset circuit, or a readout circuit. Typically, the shared storage device may be for accumulating the charge in the focal plane.

SUMMARY OF THE INVENTION

An object of this invention is to provide a multiple photosensor pixel image sensor layout optimized to match display layout.

Another object of this invention is to provide a multiple photosensor pixel image sensor.

Further, another object of this invention is to provide a multiple photosensor pixel image sensor with high fill factor and high symmetry.

Even further, another object of this invention is a multiple photosensor pixel image sensor with a shared column output node a shared storage node.

Still further, another object of this invention is to provide a multiple photosensor pixel image sensor that senses differentiated color components of light.

To accomplish at least one of these objects, a pixel image sensor integrated circuit is fabricated on a substrate. The pixel image sensor integrated circuit includes an array of multiple photosensor pixel image sensors for sensing differentiated color components of light impinging upon the multiple photosensor pixel image sensor. Each multiple photosensor pixel image sensor has a plurality of photo-sensing devices formed with the surface of the substrate. Each photo-sensing device has a structure adjusted to convert photons of the light to photoelectrons representative of a magnitude of the color component or hue of the light for which the structure of the photo-sensing device is adjusted. Each multiple photosensor pixel image sensor includes at least one storage node and a plurality of triggering switches. The storage node is formed within the surface of the surface of the substrate and is connected to selectively receive photoelectrons from each of the plurality of photo-sensing devices. Each of the plurality of triggering switches is connected between one of the plurality of photo-sensing devices and one of the storage nodes to selectively and sequentially transfer the photoelectrons from each of the plurality of photo-sensing devices to the storage node. Each of the multiple photosensor pixel image sensors includes at least one reset triggering switch in communication with the one of the storage nodes and those of the triggering switches connected to the one storage node to place the storage node to a reset voltage level after integration and before and/or after sensing of the photoelectrons.

The array of multiple photosensor pixel image sensors are sensitive to the color components including red, green, and blue; red and green; green and blue; or red and blue. Those of the plurality of photo-sensing devices that are to sense the red and green color component include a deep diffusion well implanted with impurities of a first conductivity type. In the preferred embodiment, the impurities of the first conductivity type are N-type impurities. Those photo-sensing devices that are to sense red and green color comprise a diffusion of a second conductivity type to create a junction within the deep diffusion for conversion of the photons to photoelectrons. Those of the plurality of photo-sensing devices that are to sense the green and blue color component include a deep diffusion well implanted with impurities of the second conductivity type. The impurity of the second conductivity type is a P-type impurity.

Further, the photo-sensing devices sensing the green and blue color component are pinned photodiodes. The pinned photodiodes include a diffusion of the first conductivity type within the deep diffusion of the second conductivity type and a shallow pinning diffusion within the diffusion of the first conductivity type and connected to a ground reference level.

Those photo-sensing devices sensing the red, green, and blue color component are photodiodes formed within an epitaxial layer of the substrate. The photo-sensing devices sensing the red, green, and blue color component are, alternately, pinned photodiodes formed within an epitaxial layer of the substrate. These pinned photodiodes also include a diffusion of the first conductivity type within the epitaxial layer and a shallow pinning diffusion within the diffusion of the first conductivity type and connected to a ground reference level.

Each multiple photosensor pixel image sensor of the array of multiple photosensor pixel image sensors further comprises at least one readout circuit connected to receive and convert photoelectrons retained by at least one storage node for conversion to an electronic signal indicative of a magnitude of the color component of the light received by one selected photo-sensing device. The readout circuit has a source follower and a pixel select switch. The source follower is connected to the storage node to receive and buffer a voltage indicative of a number of photoelectrons retained at the storage node. The pixel select switch is selectively connected to the source follower to transfer the buffered voltage indicative of the number of photoelectrons at the storage node to external circuitry for further processing.

The pixel image sensor integrated circuit further includes a color filter array arranged on the surface of the substrate and superimposed upon the array of multiple photosensor pixel image sensor. The color filter array has a plurality of color filtering regions to differentiate light impinging upon the multiple photosensor pixel image sensor into at least one color hue. The color filtering regions are tinted to filter the light to the color hues. The color hues are yellow/magenta, yellow/blue, magenta/cyan, or transparent/red. The color filtering regions are arranged such that the multiple photosensor pixel image sensor and the color filter array generate image data matching a pixel color arrangement of a display.

BRIEF DESCRIPTION OF THE DRAWINGS

FIGS. 1a-1c are a top plan view and cross sectional views of a photo-detector CMOS active pixel image sensor of the prior art.

FIGS. 2a-2e are a top plan views, cross sectional views and schematics of a first embodiment multiple photosensor pixel image sensor of this invention.

DETAILED DESCRIPTION OF THE INVENTION

Figure 2A:
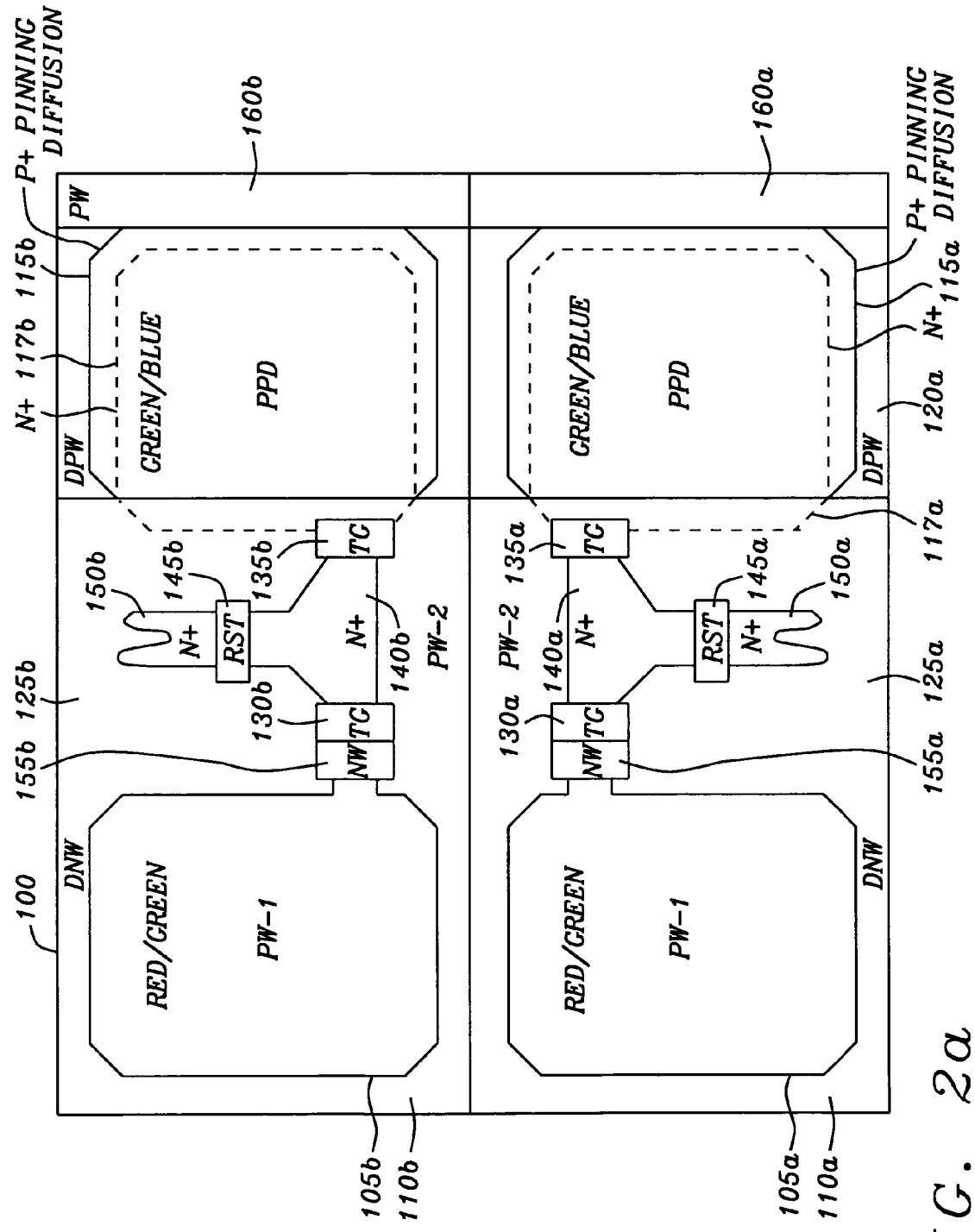

The multiple photosensor pixel image sensor of this invention preferably has four photo-sensing devices formed in a 2×2 matrix. Each pair of the photo-sensing devices have their sensitivities tuned to be sensitive to one particular color component or hue of light emitted or reflected from an object. The multiple photosensor pixel image sensors as structured have a high fill factor and high symmetry. The photo-sensing devices may share common storage nodes and/or common readout circuitry to a common output node. The multiple photosensor pixel image sensor of this invention in combination with a color filter array to provide a digital image data that is approximately equivalent to that of a display.

Each of the photo-sensing devices is connected through a triggering switch to one of the common storage nodes of the multiple photosensor pixel image sensor. Each storage node is in turn connected through a reset switch to power supply voltage source (VDD) for resetting each of the photo-sensing devices and the storage node to the voltage level of the power supply voltage source (VDD). The storage node is connected to a source follower of the readout circuit. The source follower provides a voltage that is proportional to the voltage of the storage node. The voltage of the storage node it a function of number of photoelectrons retained by the storage node after conversion of the photons to the photoelectrons and integration of the photoelectrons. A selection switch is connected to the output of the source follower of the readout circuit to selectively connect the source follower to the output node of the multiple photosensor pixel image sensor. The output of the source follower is transferred to external circuitry for further processing.

It is known, as shown in "Photodiode Characteristics and Applications", Product Catalog (2003), UDT Sensors, Inc., Hawthorne, Calif. 90250, found www.udt.com, Sep. 5, 2005, that electrons in silicon forced into the conduction band by photons with energies greater than 1.12eV, which corresponds to wavelengths shorter than 1100 nm. The resulting electrons in the conduction band are free to conduct current. Due to concentration gradient, the diffusion of electrons from an N-type region to a P-type region and the diffusion of holes from a P-type region to an N-type region develop a built-in voltage across the junction. The inter-diffusion of electrons and holes between N and P regions across the junction results in a region with no free carriers. This is the depletion region. The built-in voltage across the depletion region results in an electric field with a maximum at the junction and no field outside of the depletion region. The electron-hole pairs generated by light are swept away by drift in the depletion region and are collected by diffusion from the undepleted region. The current generated is proportional to the incident light (number of photons) or radiation power. The light is absorbed exponentially with distance from the surface of the substrate and is proportional to the absorption coefficient. The absorption coefficient is very high for shorter wavelengths in the visible blue region (approximately 400 nm) and is small for longer red wavelengths of approximately 700 nm. Hence, short wavelength photons, such as blue, are absorbed in a thin top surface layer of approximately 100 nm. Silicon becomes transparent to light wavelengths longer than 1200 nm to depths of approximately 100 µm.

It is known, as shown in "Photodiode Characteristics and Applications", Product Catalog (2003), UDT Sensors, Inc., Hawthorne, Calif. 90250, found www.udt.com, Sep. 5, 2005, that electrons in silicon forced into the conduction band by photons with energies greater than 1.12 eV, which corresponds to wavelengths shorter than 1100 nm. The resulting electrons in the conduction band are free to conduct current. Due to concentration gradient, the diffusion of electrons from an N-type region to a P-type region and the diffusion of holes from a P-type region to an N-type region develop a built-in voltage across the junction. The inter-diffusion of electrons and holes between N and P regions across the junction results in a region with no free carriers. This is the depletion region. The built-in voltage across the depletion region results in an electric field with a maximum at the junction and no field outside of the depletion region. The electron-hole pairs generated by light are swept away by drift in the depletion region and are collected by diffusion from the undepleted region. The current generated is proportional to the incident light or radiation power. The light is absorbed exponentially with distance from the surface of the substrate and is proportional to the absorption coefficient. The absorption coefficient is very high for shorter wavelengths in the visible blue region (approximately 400 nm) and is small for longer red wavelengths of approximately 1200 nm. Hence, short wavelength photons, such as blue, are absorbed in a thin top surface layer of approximately 100 nm. Silicon becomes transparent to light wavelengths longer than 1200 nm to depths of approximately 100 μm.

By adjusting the diffusion depths of the photo-sensing devices of the multiple photosensor pixel image sensor of this invention, the sensitivities tuned to be sensitive to one particular color component or hue of light emitted or reflected from an object. This tuning of the sensitivities of the photo-sensing devices coupled with the appropriate color filtering regions of a color filter array permits an image capture system employing the multiple photosensor pixel image sensor of this invention to acquire an image and generate digital data representing that image in a format that is equivalent to a display that will display the image.

Refer now to FIGS. 2a-2e for a discussion of a first embodiment multiple photosensor pixel image sensor of this invention. FIG. 2a illustrates the 2×2 symmetry of the 2×2 multiple photosensor pixel image sensor 100 of this invention. A pair of Red-Green photo-sensing devices are formed of the junction of the P-wells 105a and 105b and the deep N-wells 110a and 110b. Similarly, a pair of Green-Blue photo-sensing devices are pinned diodes formed of the N+ diffusions 115a and 115b and the shallow P+ diffusions 117a and 117b. The junction of the N+ diffusions 115a and 115b and the deep P-wells 120a and 120b are the regions for the collection of the Green-Blue photons collected by the photo-sensing devices.

Figure 2B:
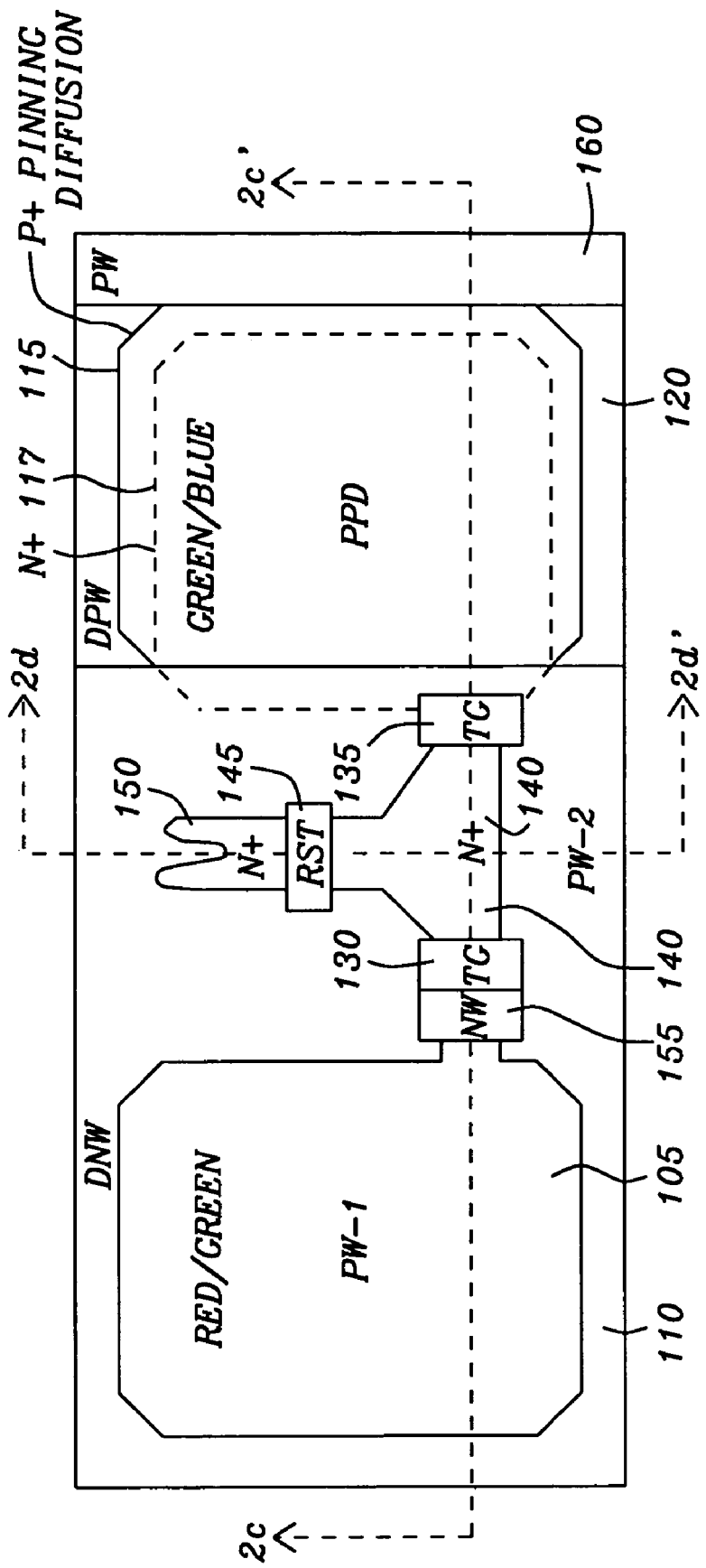
Figure 2D:
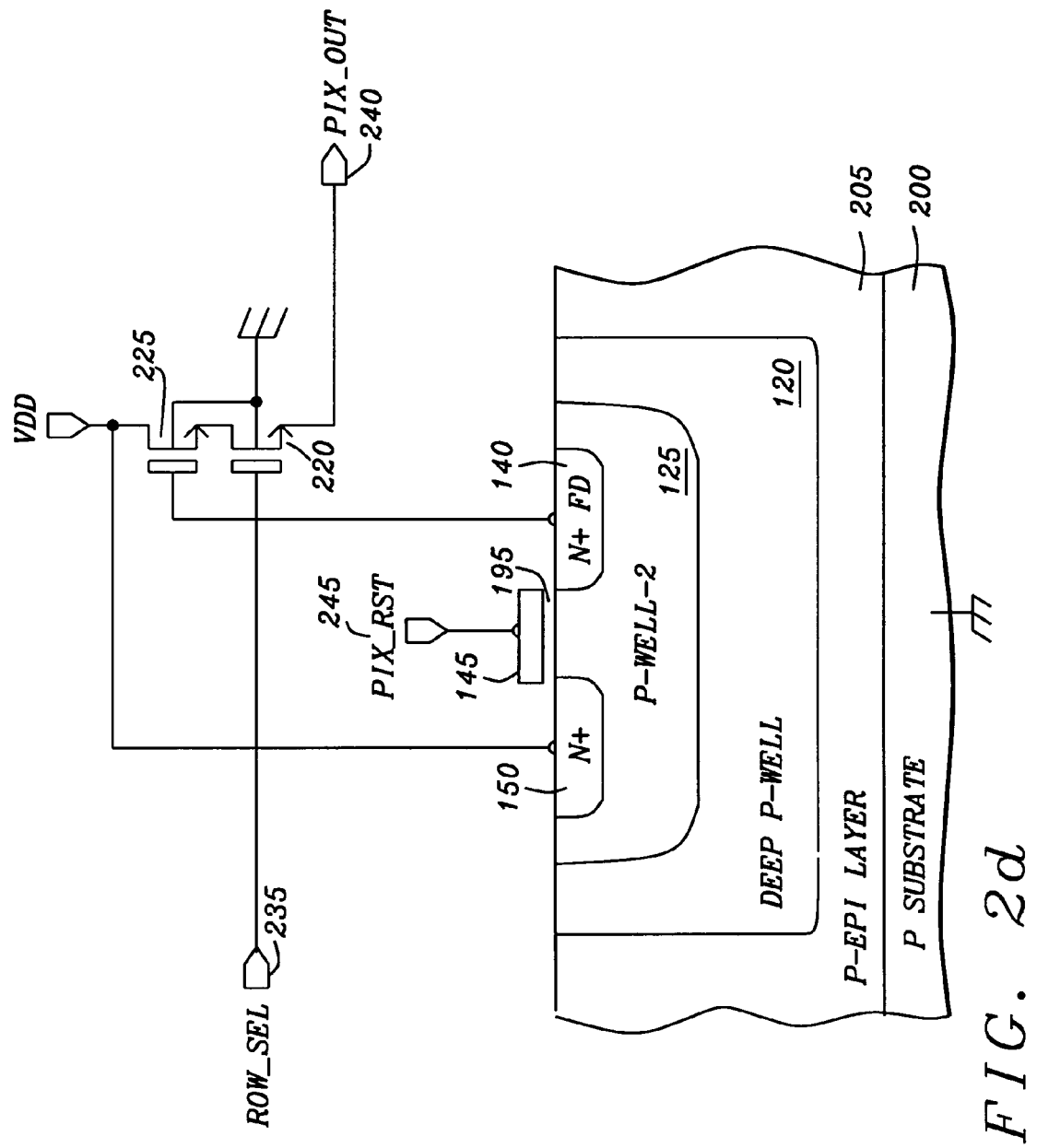

FIG. 2b illustrates two photo-sensing devices of the multiple photosensor pixel image sensor of FIG. 2a showing the locations of the cross sectional views shown in FIGS. 2c and 2d. The multiple photosensor pixel image sensor as shown in FIG. 2a is essentially two of the two photo-sensing devices of FIG. 2b that have a common power supply voltage source (VDD) node and/or a common output node. The components described for the multiple photosensor pixel image sensor of FIG. 2a are identical as FIG. 2b. The numbers of these components for FIG. 2b are the same as FIG. 2a without the alphabetic suffix.

Refer now to FIGS. 2c and 2d for a discussion structure of multiple photosensor pixel image sensor of this invention. FIGS. 2c and 2d are orthogonal cross sectional views of the array of FIG. 2b. A substrate 200 heavily doped with a P-type impurity has its surface further doped with a complementary impurity to create a lightly doped P-type epitaxial layer 205. A P-type material is diffused into the surface of the substrate 200 to form the contact diffusions not shown for the P-type epitaxial layer 205. An N-type material is deeply diffused into the surface of the substrate 200 to a relatively great depth in the area into which the Red-Green sensitive photo-sensing device is to be place to form the deep N-well isolation barrier 110. The P-type material is deeply diffused into the surface of the substrate 200 to a relatively great depth in the area into which the Green-Blue photo-sensing device is to be placed to form the deep P-well conduction well 120.

The N-type material is then diffused into the surface of the substrate 200 to contact the deep N-well isolation barrier 110 and form the diffusion N-well 155. The P-type material is then diffused into the surface of the substrate 200 to a depth that is greater than the blue wavelength to insure complete absorption of the blue wavelength. This depth has to be greater than approximately 1.0 μm. The diffused P-type material creates the first P-well 105 that creates the junction for the conversion of the Red-Green light to photoelectrons. Simultaneously, the P-type material is diffused into the surface of the substrate 200 to form the second P-well 125 that is hold the storage node 140 of the multiple photosensor pixel image sensor. Also, simultaneously, the P-type material is diffused into the surface of the substrate 200 to form the P-well 160 at the boundary of the multiple photosensor pixel image sensor and is in contact with the deep P-well conduction well 120.

The N-type material is then diffused into the surface of the substrate 200 to form the N+ photodiode depletion region 117. The P-type material is heavily diffused relatively shallow into the surface of the epitaxial layer 205 of the substrate 200 above the N+ photodiode depletion region 117 to form the P-type pinning diffusion 115. The P-type pinning diffusion 115 encompasses the surface of most of the N+ photodiode depletion regions 117 and overlaps into the surface of the P-type isolation wells 160. The junction of the P-type pinning diffusion and the junction of the N+ photodiode depletion region 117 permits the conversion of the photons of the Green and Blue wavelengths to the photoelectrons.

The P-type wells 125 and 160 are in contact with the deep P-well conduction well 120 which in turn is in contact with the P-type epitaxial layer 205 of the substrate 200. The substrate is in turn connected to the ground reference voltage source. The contact of the P-type pinning diffusion 115 by its overlap into the surface of the P-type isolation well 160 establishes the connection of the P-type pinning diffusion 115 to the ground reference level.

The N-type material is heavily diffused into the surface of the substrate 200 at the location of the second P-type well 125 to form the N+ source/drain region 150 and the floating diffusion storage node 140. The N+ source/drain region 150 and the floating diffusion storage node 140 form the reset gate switch transistor for the two photo-sensing devices. The floating diffusion storage node 140. and the N-well 155 form the transfer gate switch transistors for each of the two photo sensing devices. A gate insulator or thin oxide 195 is placed on the surface of the substrate 200 and polycrystalline silicon is formed on the surface to form the first transfer gate 130, the second transfer gate 135, and the reset gate 145.

The transfer gates 130 and 135 of the transfer gate switch transistors are respectively connected to transfer gating signals T_GT1 215 and T_GT2 220. The reset gate 145 of the reset gate switch transistor is connected to the pixel reset signals PIX_RST 245. The N+ source/drain region 150 are connected to a power supply voltage source VDD. The floating diffusion storage node 140 is connected to the gate of the CMOS transistor 225. The drain of the CMOS transistor 225 is connected to the power supply voltage source VDD and the source of the CMOS transistor 225 is connected to the drain of the CMOS transistor 230. The gate of the CMOS transistor 230 is connected to the row select signal 235. The CMOS transistor 225 acts as a source follower to buffer the electrical signal created by the photoelectron charge collected in the floating diffusion 140.

The photons 210 that impinge upon first P-well 105 of the Red-Green photo-sensing device and the pinned photodiode of the Green-Blue photo-sensing devices are converted to photoelectrons and collected respectively through the deep N-well isolation barrier 110 to the N-well 155 and in the N+ photodiode depletion region 117. A mechanical or electrical shutter is activated to expose the image sensor to the photons 210 of the light image for an integration period. At the completion of the integration period for the collection of the photoelectrons, the reset gate 145 is turned ON by PIX_RST 245 to reset the storage node 140 to RESET level, the row select signal 235 is activated to turn ON the transistor 230 to gate the pixel output electrical signal PIX_OUT 240 to external circuitry for sampling the RESET level. After that, the first transfer gate 130 is activated by the transfer gating signal T_GT1 215 to turn on the transfer gate switch transistor to transfer the collected photoelectrons from the N-well 155, to the storage node of the floating diffusion 140. When the collected photoelectrons are retained at the floating diffusion 140 the row select signal 235 is activated to turn on the transistor 230 to gate the pixel output electrical signal PIX_OUT 240 to external circuitry for sampling the SIGNAL level. The differential amplitude of pixel output electrical signal PIX_OUT 240 of sampled RESET level and sampled SIGNAL level is indicative of the intensity of the light energy or the number of photons 210 absorbed by the deep N-well 110 of the Red-Green photo-sensing device. The first transfer gating signal T_GT1 215 is deactivated to turn off the transfer gate switch transistor. The reset gate 145 is turned on again by PIX_RST 245 to reset the storage node 140 to RESET level, the row select signal 235 is activated to turn ON the transistor 230 to gate the pixel output electrical signal PIX_OUT 240 to external circuitry for sampling the RESET level. Then, the second transfer gate 135 is activated by the transfer gating signal T_GT2 220 to turn on the transfer gate switch transistor to transfer the collected photoelectrons from the in the N+ photodiode depletion region 117, to the storage node of the floating diffusion 140. When the collected photoelectrons are retained at the floating diffusion 140 the row select signal 235 is activated to turn on the transistor 230 to gate the pixel output electrical signal PIX_OUT 240 to external circuitry for sampling the SIGNAL level. The differential amplitude of pixel output electrical signal PIX_OUT 240 of sampled RESET level and sampled SIGNAL level is indicative of the intensity of the light energy or the number of photons 210 absorbed by the pinning diffusion 115 and the in the N+ photodiode depletion region 117 of the Green-Blue photo-sensing device.

Once the pixel output electrical signal PIX_OUT 240 is read out the pixel reset signal 245 is activated to turn on the reset gate switch. The transfer gating signals T_GT1 215 and T_GT2 220 are simultaneously activated to turn on the two transfer gate switch transistors. The deep N-well isolation barrier 110 and the N+ photodiode depletion region 117 and the storage node floating diffusion 140 are emptied of the photoelectrons.

An optional metal shield 245 maybe placed over the transfer gate switches and the reset gate switches to prevent the light energy 210 from impinging upon the transfer gate switch and the reset gate switch and is not converted to stray photoelectrons that collect in the floating diffusion 140. The metal shield 245 maybe either a separate shield placed above the transfer gate switches and the reset gate switches or maybe the interconnecting wiring, interlayer vias, and substrate contact metallurgy placed above the transfer gate switches, and the reset gate switches.

Figure 2E:
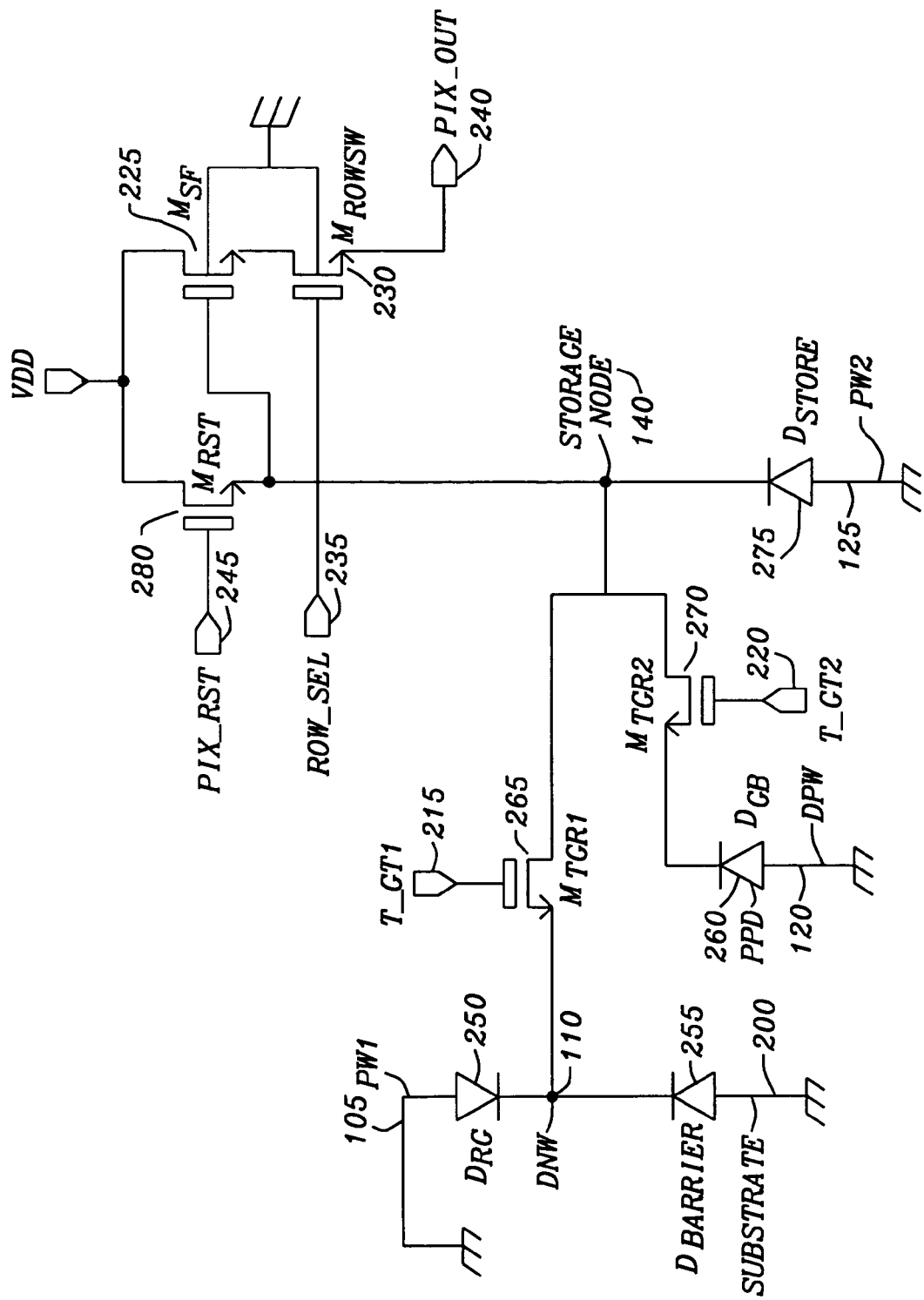

Refer now additionally to FIG. 2e for a schematic of two photo-sensing devices of the multiple photosensor pixel image sensor of this invention to explain component structure. The junction between the first P-well 105 of the Red-Green photo-sensing device and the deep N-well isolation barrier 110 forms the Red-Green sensing photodiode $D_{RG}$ 250. The junction between the deep N-well isolation barrier 110 and the substrate 200 forms the barrier diode 255. The deep N-well isolation barrier 110 is the source of the transfer gate switch transistor 265. The drain of the transfer gate switch transistor 265 is the storage node floating diffusion 140. The gate of the transfer gate switch transistor 265 is the gate 130 connected to the first transfer gating signal T_GT1 215. The junction of the deep P-well conduction well 120 and the N+ photodiode depletion region 117 with the shallow P+ pinning layer 115 form the pinned photodiode 260. The N+ photodiode depletion region 117 forms the source of the transfer gate switch transistor 270. As with the transfer gate switch transistor 265, the storage node floating diffusion 140 is the drain of the transfer gate switch transistor 270. The gate of the transfer gate switch transistor 270 is the gate 135 connected to the first transfer gating signal T_GT2 220.

The source of the reset gate switch transistor 280 is the storage node floating diffusion 140 and its drain is the N+ source/drain region 150. The gate 145 of the reset gate switch transistor 280 is connected to the reset signal 245. The structure and connection of the source follower transistor 225 and the row switching transistor 230 is as described above.

Figure 3A:
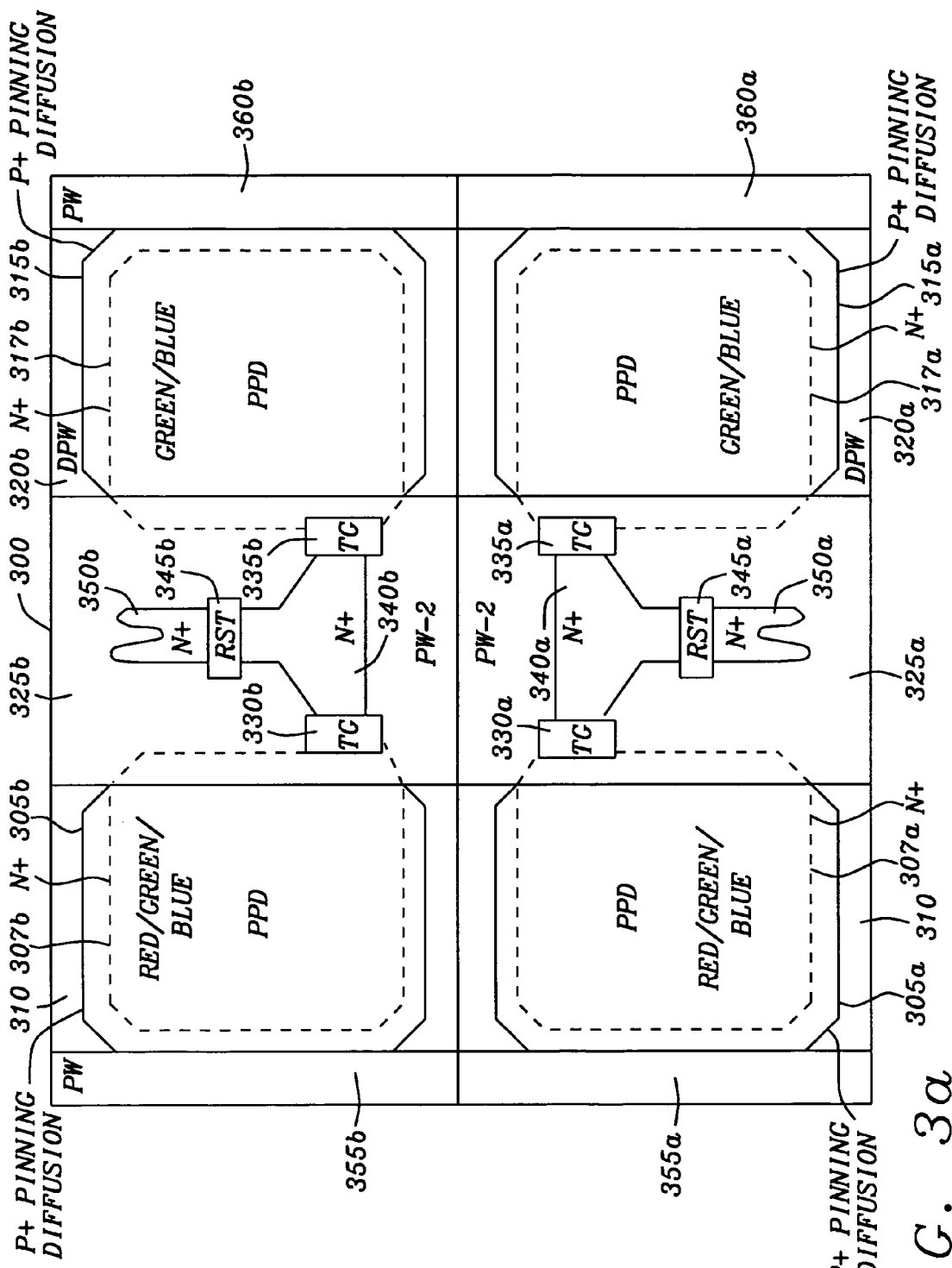
FIGS. 3a-3d are a top plan views, cross sectional views and schematics of a second embodiment multiple photosensor pixel image sensor of this invention.
Figure 3B:
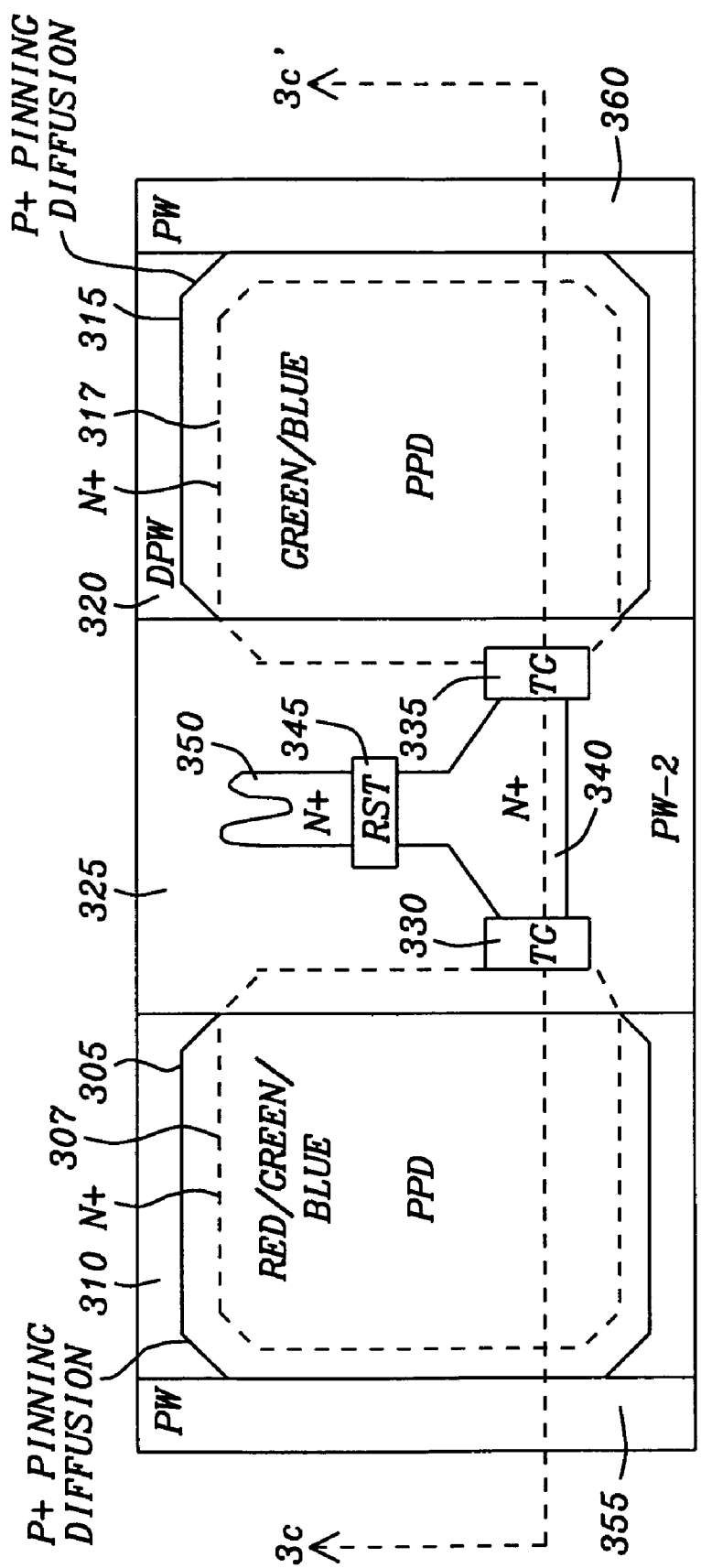
Figure 3C:
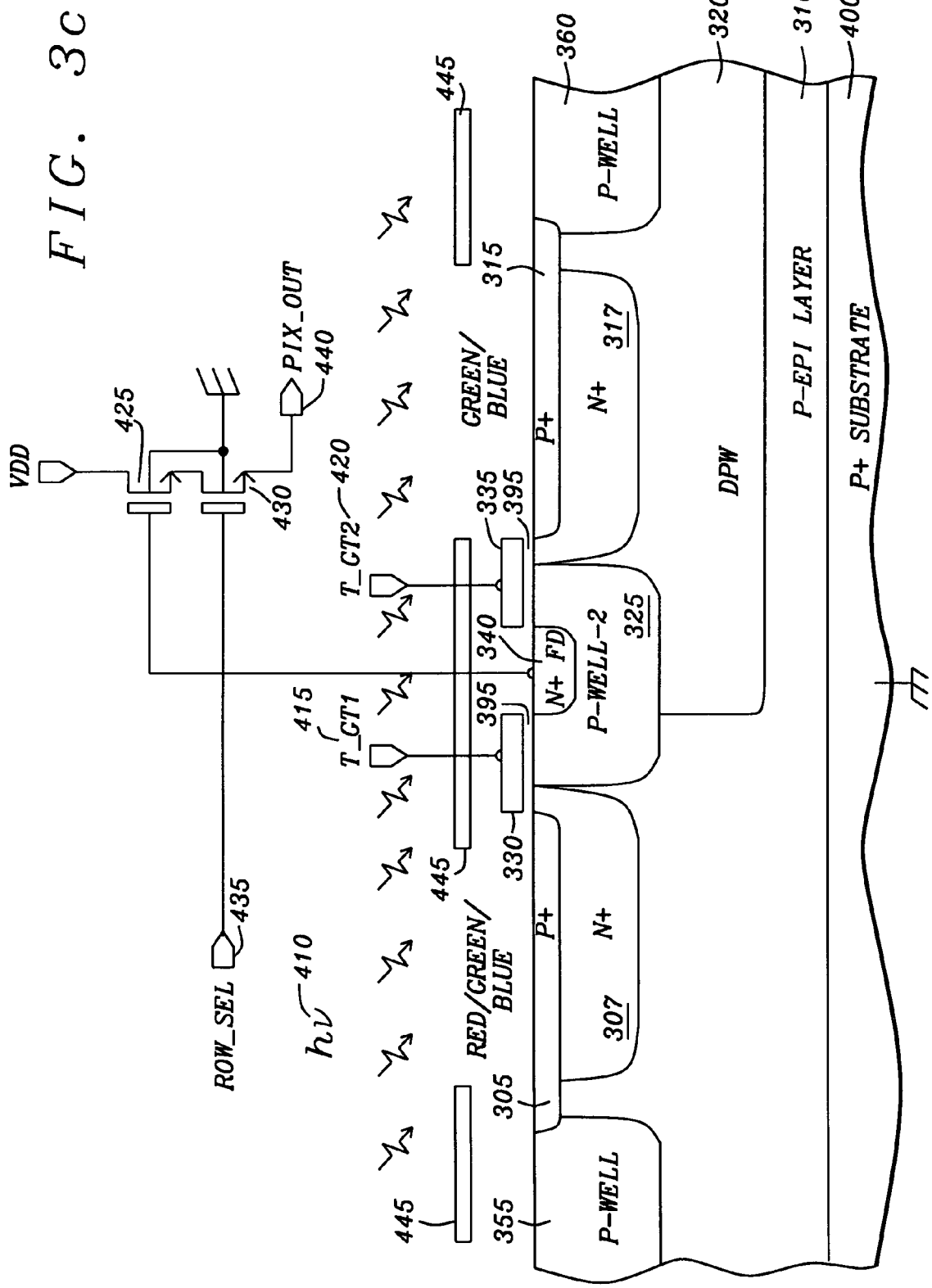

FIGS. 3a-3c illustrate a second embodiment multiple photosensor pixel image sensor of this invention. FIG. 3a illustrates the 2×2 symmetry of the 2×2 multiple photosensor pixel image sensor 300 of this invention. A pair of Red-Green-blue photo-sensing devices is formed of the junction of the N-type diffusion 307a and 307b of the pinned photodiode and the p-type epitaxial 310. Similarly, a pair of Green-Blue photo-sensing devices is pinned photodiodes formed of the N+ diffusions 317a and 315b and the shallow P+ diffusions 315a and 315b. The junction of the N+ diffusions 317a and 317b and the deep P-wells 320a and 320b are the regions for the collection of the Green-Blue photons collected by the photo-sensing devices.

FIG. 3b illustrates two photo-sensing devices of the multiple photosensor pixel image sensor of FIG. 3a showing the locations of the cross sectional views shown in FIG. 3c. The multiple photosensor pixel image sensor as shown in FIG. 3a is essentially two of the two photo-sensing devices of FIG. 3b that have a common power supply voltage source (VDD) node and/or a common output node. The components describe of the multiple photosensor pixel image sensor of FIG. 3a are identical as FIG. 3b. The numbers of these components for FIG. 3b are the same as FIG. 3a without the alphabetic appending.

Refer now to FIG. 3c for a discussion structure of multiple photosensor pixel image sensor of this invention. FIG. 3c is a cross sectional views of the array of FIG. 3b. A substrate 400 heavily doped with a P-type impurity has its surface further doped with a complementary impurity to create a lightly doped P-type epitaxial layer 310. A P-type material is diffused into the surface of the substrate 400 to form the contact diffusions not shown for the P-type epitaxial layer 310. The P-type material is deeply diffused into the surface of the substrate 400 to a relatively great depth in the area into which the Green-Blue photo-sensing device is to be placed to form the deep P-well (DPW) conduction well 320.

The P-type material is then diffused into the surface of the substrate 400 to the diffusion P-wells 355 and 360. Simultaneously, the P-type material is diffused into the surface of the substrate 400 to form the second P-well (P-WELL-2) 325 that is hold the storage node 340 of the multiple photosensor pixel image sensor. The P-type wells 325 and 360 are in contact with the deep P-well conduction well 320 which in turn is in contact with the P-type epitaxial layer 310 of the substrate 400. The diffusion P-well 355 is in direct contact with the P-type epitaxial layer 310 of the substrate 400. The substrate is in turn connected to the ground reference voltage source.

The N-type material is then diffused into the surface of the substrate 400 to create the first N+ photodiode depletion region 307 and the second N+ photodiode depletion region 317. The first N+ photodiode depletion region 307 is the junction for the conversion of the Red-Green-Blue light to photoelectrons and the second N+ photodiode depletion region 317 that creates the junction for the conversion of the Green-Blue light to photoelectrons.

The P-type material is heavily diffused to a relatively shallow depth into the surface of the epitaxial layer 310 of the substrate 400 above the N+ photodiode depletion regions 307 and 317 to form the P-type pinning diffusions 305 and 315. The P-type pinning diffusions 305 and 315 respectively encompass the surface of most of the N+ photodiode depletion regions 307 and 317 and overlap into the surface of the P-type isolation wells 355 and 360. The junction of the P-type pinning diffusion 305 and the junction of the N+ photodiode depletion region 307 permits the conversion of the photons of the Red, Green, and Blue wavelengths to the photoelectrons. The junction of the P-type pinning diffusion 315 and the junction of the N+ photodiode depletion region 317 permit the conversion of the photons of the Green and Blue wavelengths to the photoelectrons.

As described above, the P-type wells 325 and 360 are in contact with the deep P-well conduction well 320 which in turn is in contact with the P-type epitaxial layer 310 of the substrate 400. The diffusion P-well 355 is in direct contact with the P-type epitaxial layer 310 of the substrate 400. The substrate 400 is in turn connected to the ground reference voltage source. The contact of the P-type pinning diffusions 305 and 315 by their overlap respectively into the surface of the P-type isolation wells 355 and 360 establishes their connection of the P-type pinning diffusions 305 and 315 to the ground reference level.

The N-type material is heavily diffused into the surface of the substrate 400 at the location of the second P-type well 325 to form the floating diffusion storage node 340. At this same time the N+ source/drain region 350 of FIG. 3b is diffused into the surface of the substrate 400. The N+ source/drain region 350 and the floating diffusion storage node 340 form the reset gate switch transistor for the two photo-sensing devices. The floating diffusion storage node 340. and the N+ photodiode depletion regions 307 and 317 form the transfer gate switch transistors for each of the two photo sensing devices. A gate insulator or thin oxide 395 is placed on the surface of the substrate 400 and polycrystalline silicon is formed on the surface to form the first transfer gate 330, the second transfer gate 335, and the reset gate 345.

The transfer gates 330 and 335 of the transfer gate switch transistors are respectively connected to transfer gating signals T_GT1 415 and T_GT2 420. The reset gate 345 of the reset gate switch transistor is connected to the pixel reset signals PIX_RST 445. The N+ source/drain region 350 is connected to a power supply voltage source VDD. The floating diffusion storage node 340 is connected to the gate of the CMOS transistor 425. The drain of the CMOS transistor 425 is connected to the power supply voltage source VDD and the source of the CMOS transistor 425 is connected to the drain of the CMOS transistor 430. The gate of the CMOS transistor 430 is connected to the row select signal 435. The CMOS transistor 425 acts as a source follower to buffer the electrical signal created by the photoelectron charge collected in the floating diffusion 340.

The photons 410 that impinge upon the first pinned photodiode of the Red-Green-Blue photo-sensing device and the pinned photodiode of the Green-Blue photo-sensing device are converted to photoelectrons and collected respectively in the N+ photodiode depletion region 307 and in the N+ photodiode depletion region 317. A mechanical or electrical shutter is activated to expose the image sensor to the photons 410 of the light image for an integration period. At the completion of the integration period for the collection of the photoelectrons, the reset gate 345 is turned on by PIX_RST 445 to reset the storage node 340 to RESET level, the row select signal 435 is activated to turn on the transistor 430 to gate the pixel output electrical signal PIX_OUT 440 to external circuitry for sampling the RESET level. After that, the first transfer gate 330 is activated by the transfer gating signal T_GT1 415 to turn on the transfer gate switch transistor to transfer the collected photoelectrons from the N+ photodiode depletion region 307, to the storage node of the floating diffusion 340. When the collected photoelectrons are retained at the floating diffusion 340 the row select signal 435 is activated to turn on the transistor 430 to gate the pixel output electrical signal PIX_OUT 440 to external circuitry for sampling the SIGNAL level. The differential amplitude of pixel output electrical signal PIX_OUT 440 of sampled RESET level and sampled SIGNAL level is indicative of the intensity of the light energy or the number of photons 410 absorbed by the pinning diffusion 305 and the N+ photodiode depletion region 307 of the Red-Green-Blue photo-sensing device. The first transfer gating signal T_GT1 415 is deactivated to turn off the transfer gate switch transistor The reset gate 345 is turned on again by PIX_RST 445 to reset the storage node 340 to RESET level, the row select signal 435 is activated to turn ON the transistor 430 to gate the pixel output electrical signal PIX_OUT 440 to external circuitry for sampling the RESET level. Then, the second transfer gate 335 is activated by the transfer gating signal T_GT2 420 to turn on the transfer gate switch transistor to transfer the collected photoelectrons from the in the N+ photodiode depletion region 317, to the storage node of the floating diffusion 340. When the collected photoelectrons are retained at the floating diffusion 340 the row select signal 435 is activated to turn on the transistor 430 to gate the pixel output electrical signal PIX_OUT 440 to external circuitry for sampling the SIGNAL level. The differential amplitude of pixel output electrical signal PIX_OUT 440 of sampled RESET level and sampled SIGNAL level is indicative of the intensity of the light energy or the number of photons 410 absorbed by the pinning diffusion 315 and the N+ photodiode depletion region 317 of the Green-Blue photo-sensing device.

Once the pixel output electrical signal PIX_OUT 440 is read out the pixel reset signal 445 is activated to turn on the reset gate switch. The transfer gating signals T_GT1 415 and T_GT2 420 are simultaneously activated to turn on the two transfer gate switch transistors. The N+ photodiode depletion region 307 and the N+ photodiode depletion region 317 and the storage node floating diffusion 340 are emptied of the photoelectrons.

An optional metal shield 445 maybe placed over the transfer gate switches and the reset gate switches to prevent the light energy 410 from impinging upon the transfer gate switch and the reset gate switch and is not converted to stray photoelectrons that collect in the floating diffusion 340. The metal shield 445 maybe either a separate shield placed above the transfer gate switches and the reset gate switches or maybe the interconnecting wiring, interlayer vias, and substrate contact metallurgy placed above the transfer gate switches, and the reset gate switches.

Figure 3D:
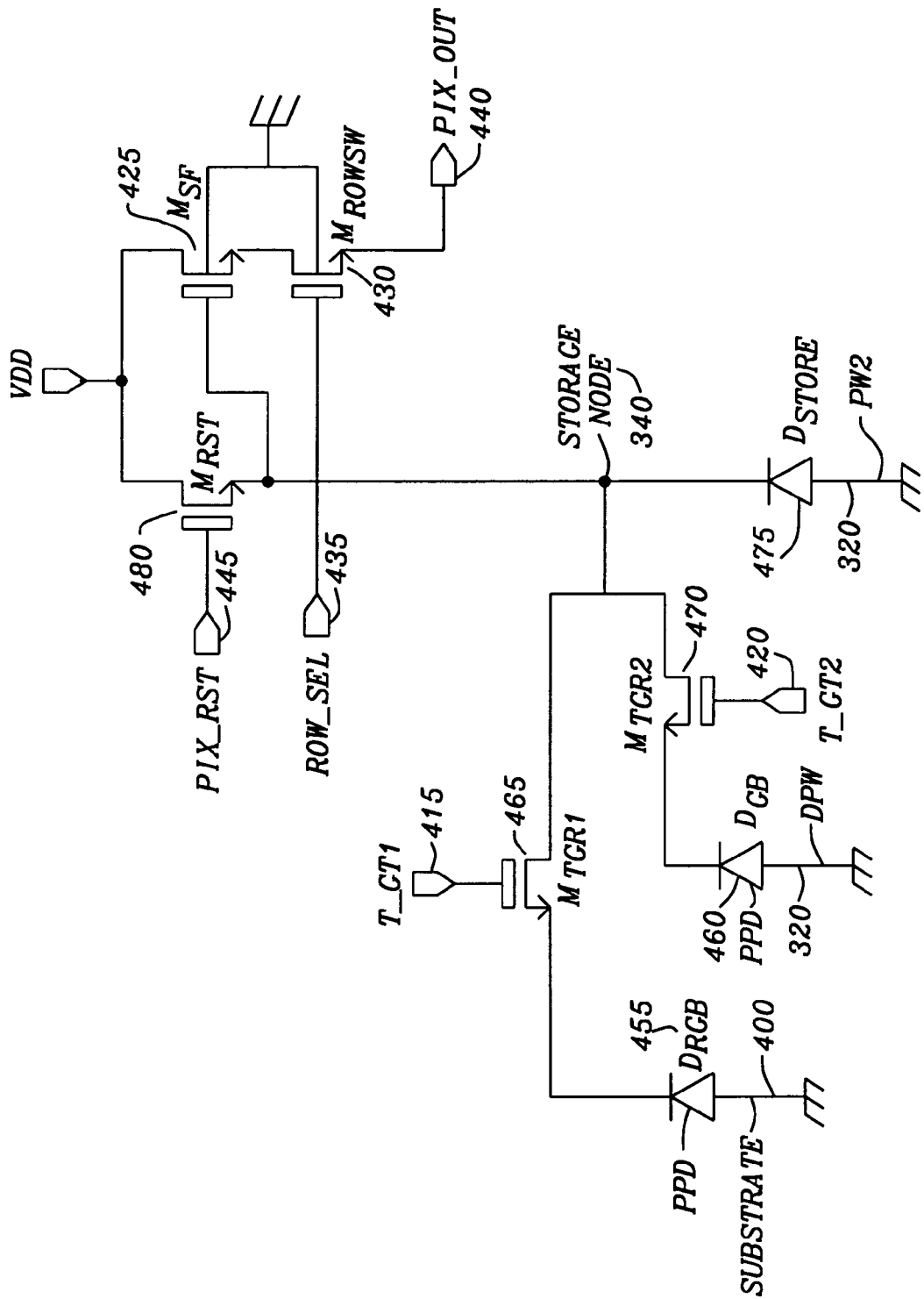

Refer now additionally to FIG. 3d for a schematic of two photo-sensing devices of the multiple photosensor pixel image sensor of this invention to explain component structure. The P-type pinning diffusion 305 and the junction of the N+ photodiode depletion region 307 and the substrate 400 form the Red-Green-Blue sensing pinned photodiode $D_{RGB}$ 455. The N+ photodiode depletion region 307 is the source of the transfer gate switch transistor 465. The drain of the transfer gate switch transistor 465 is the storage node floating diffusion 340. The gate of the transfer gate switch transistor 465 is the gate 330 connected to the first transfer gating signal T_GT1 415. The junction of the deep P-well conduction well 320 and the N⁺ photodiode depletion region 317 with the shallow P⁺ pinning layer 315 form the pinned photodiode $D_{GB}$ 460 of the Blue-Green photo-sensing device. The N⁺ photodiode depletion region 317 forms the source of the transfer gate switch transistor 470. As with the transfer gate switch transistor 465, the storage node floating diffusion 340 is the drain of the transfer gate switch transistor 470. The gate of the transfer gate switch transistor 470 is the gate 335 connected to the first transfer gating signal T_GT2 420. The N+ diffusion storage node 340 and P-WELL-2 $325_{[GY1]}$ form the storage diode 475.

The source of the reset gate switch transistor 480 is the storage node floating diffusion 340 and its drain is the N⁺ source/drain region 350 shown in FIG. 3b. The gate 345 of the reset gate switch transistor 480 is connected to the reset signal 445. The structure and connection of the source follower transistor 425 and the row switching transistor 430 is as described above.

Figure 4:
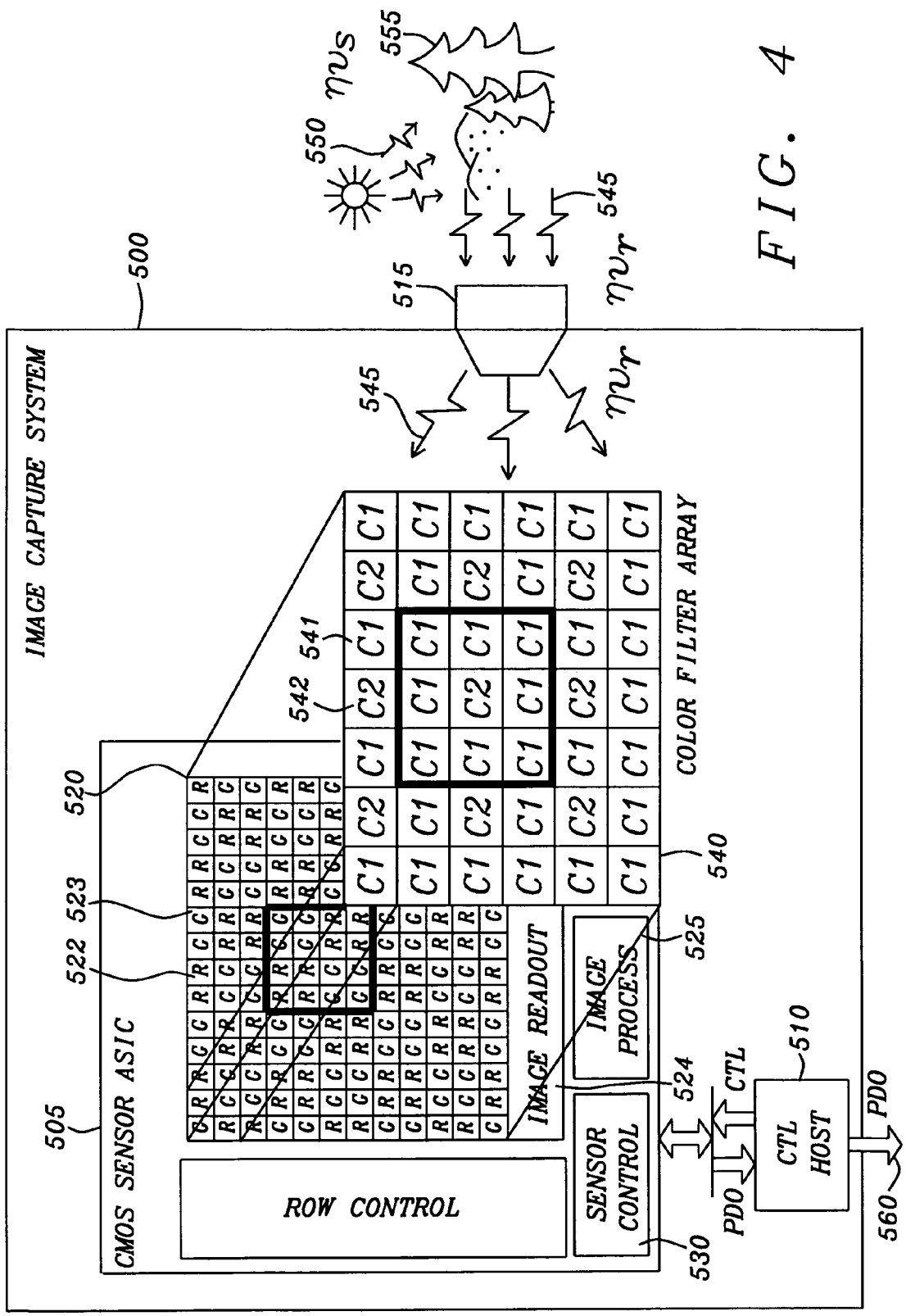
FIG. 4 is a diagram illustrating an image capture system of this invention.

An image capture system using the multiple photosensor pixel image sensor of this invention is illustrated in FIG. 4. The image capture system 500 includes the image processing application specific integrated circuit 505, control host 510, and a focusing lens 515. As described above the image processing application specific integrated circuit 505 contains a multiple photosensor pixel image sensor array 520 and on-chip image processing 525. The image processing application specific integrated circuit 505 also contains sensor I/O control 530 with an interface with the control host 510. Switching control activates opening and closing the mechanical shutter 515 to allow passage of reflected light 545 to enter the image capture system 500 and impinge upon the array of multiple photosensor pixel image sensors 520. Ambient lighting 550 is reflected from a scene 555 as the reflected light 545.

The snapshot pinned photodiode CMOS active pixel image sensors of the array 520 of this invention are as described in FIGS. 2a-2e or alternately FIGS. 3a-3d. The color filter array 540 is placed above the array of multiple photosensor pixel image sensors 520. The organization of the filter regions 541 and 542 of the color filter array 540 are arranged to be aligned with the photo-sensing devices 522 and 523 of each multiple photosensor pixel image sensor of the array of multiple photosensor pixel image sensor 520 such that the image capture system 500 produces image data 560 that is organized to be equivalent to a video display such as the data structure described above in Brown-Elliot and commonly referred to as a pentile matrix.

The ambient lighting 550 reflects from the scene 555 and the reflected light 545 is filtered by the color filter regions 541 and 542 of the color filter array 540 and captured by the array of multiple photosensor pixel image sensors 520. The array of the multiple photosensor pixel image sensors 520 converts the photons of the reflected lighting 545 to photoelectrons. The image readout 524 generates digital data signals which are further manipulated by the image processor 525 and transferred from the control host 510 as the pixel data output 560 for eventual display.

Figure 5A:
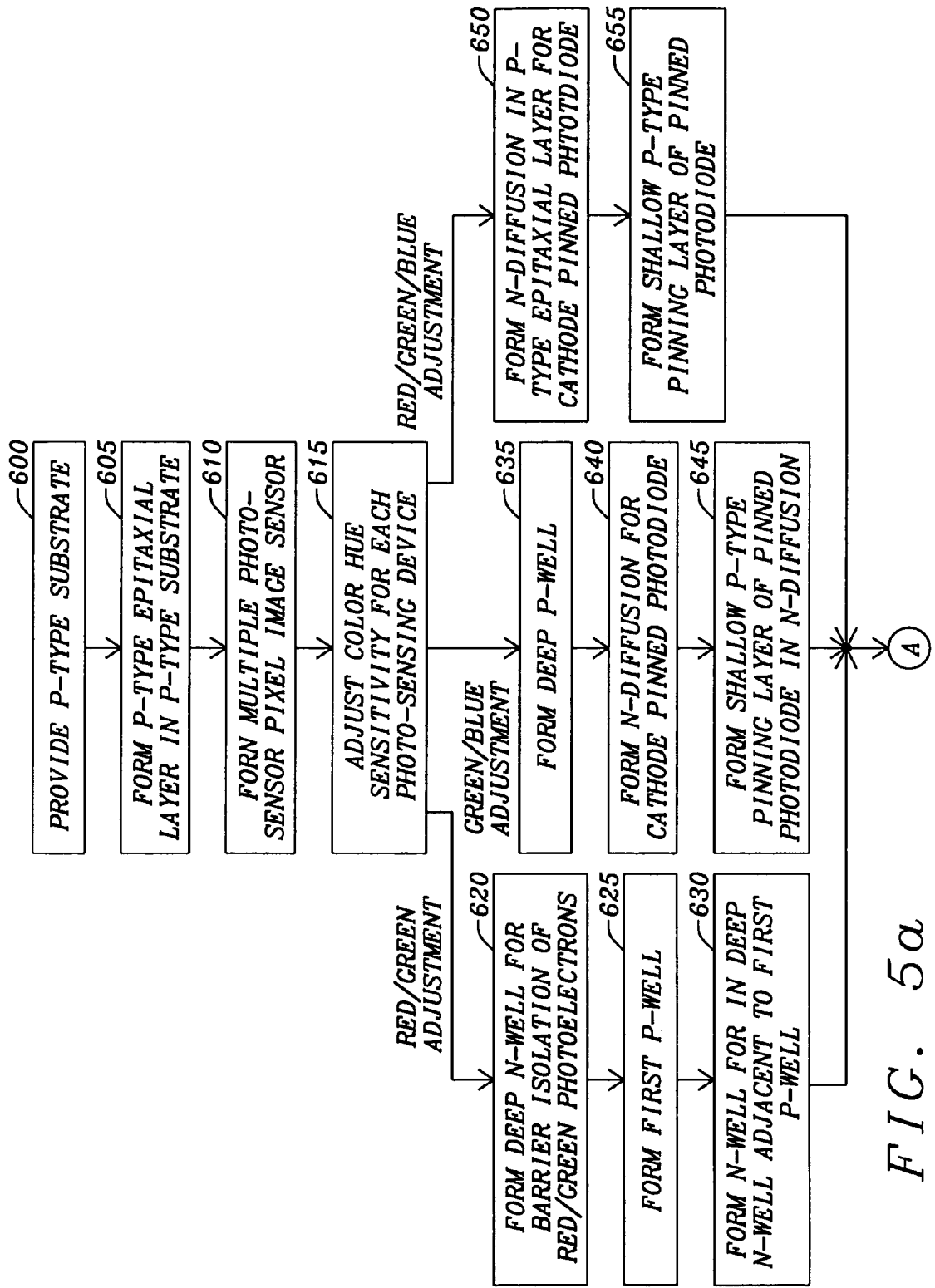
FIGS. 5a and 5b are flowcharts illustrating the method for fabricating a multiple photosensor pixel image sensor of this invention.
Figure 5B:
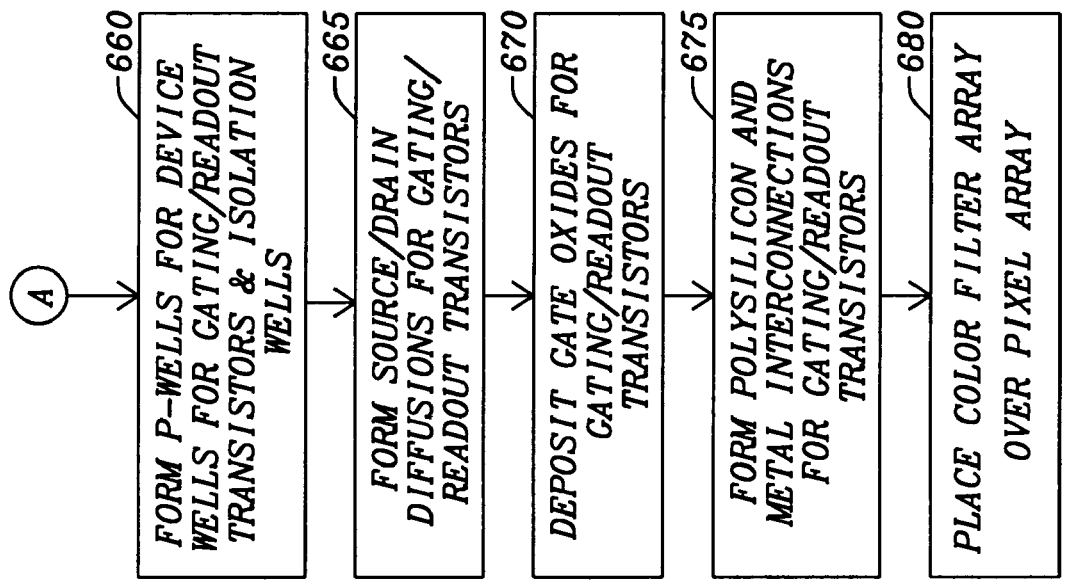

Refer now to FIGS. 5a and 5b for a method for fabricating an integrated circuit having an array of multiple photosensor pixel image sensors on a provided P-type substrate (Box 600). An P-type epitaxial layer is diffused into the substrate (Box 605). An array of multiple photosensor pixel image sensors are formed (Box 610) for sensing differentiated color components of light impinging upon the multiple photosensor pixel image sensor. The multiple photosensor pixel image sensor is formed (BOX 606) by forming a plurality of photo-sensing devices within the surface of the substrate. The structure of the photo-sensing devices are adjusted (Box 615) to set the color hue sensitivity of the photo-sensing devices. The adjusting (Box 615) of the structure of each photo-sensing device allows conversion photons of the light to photoelectrons representative of a magnitude of the color component of the light for which the structure of the photo-sensing device is adjusted.

The photo-sensing devices that are to be sensitive to Red-Green hues of the visible light spectrum have a deep N-well formed (Box 620) in the epitaxial layer of the substrate to form a barrier isolation layer for collection of the photoelectrons. A P-type material is diffused into the area of the deep N-well to form (Box 625) the first P-well. The junction between the deep N-well and the first P-well is sufficiently deep from the surface of the substrate that photons having a blue wavelength are absorbed into the first P-well and the Red-Green photon generates the photoelectrons at the junction. An N-type material is diffused into the surface of the substrate adjacent to the first P-well and in contact with the deep N-well to form (Box 630) an N-well that acts as collector of the photoelectron for transfer.

The photo-sensing devices that are to be sensitive to Green-Blue hues of the visible light spectrum have a deep P-well formed (Box 635) in the epitaxial layer of the substrate to form a deep P-well conduction well for conduction of the photo-charges (holes). A N-type material is diffused into the area of the deep P-well to form (Box 640) the N⁺ photodiode depletion regions of the pinned photodiode in the deep P-well. The junction between the deep P-well and the N⁺ photodiode depletion regions is sufficiently shallow from the surface of the substrate that photons having Green-Blue wavelength generate the photoelectrons at the junction. An P-type material is diffused into the surface of the substrate covering most of the N⁺ photodiode depletion region to form (Box 645) the pinning layer of the pinned photodiode that converts the Green-Blue color hues to photoelectrons.

The photo-sensing devices that are to be sensitive to Red-Green-Blue hues (essentially white light) of the visible light spectrum have an N-type material diffused into the P-type epitaxial layer of the substrate to form (Box 650) the N⁺ photodiode depletion regions in the epitaxial layer. The junction between the P-type epitaxial layer and the N⁺ photodiode depletion region is sufficiently shallow from the surface of the substrate that photons having Green-Blue wavelength generate the photoelectrons at the junction, while being sufficiently deep to convert the photon of the Red wavelength. An P-type material is diffused into the surface of the substrate covering most of the N⁺ photodiode depletion region to form (Box 655) the pinning layer of the pinned photodiode that converts the Green-Blue color hues to photoelectrons.

Each of the multiple photosensor pixel image sensors generally has a photo-sensing device adjusted for sensing the Green-Blue color hue and thus, has a deep P-well. Shallower P-wells are formed (Box 660) in the deep P-well. These Shallower P-wells are either isolation wells or contain the transfer gating and readout transistors of each multiple photosensor pixel image sensor. The source/drain diffusions of the transfer gating and readout transistors are formed (Box 665). One of these diffusions is the storage node floating diffusion that receives the photoelectrons upon completion of the integration of the photoelectrons. A gate oxide is formed (Box 670) on the surface of the substrate for the transfer gating and readout transistors. The appropriate polysilicon gates and metal interconnections are formed (Box 675) to complete the transfer gating and readout transistors and their interconnections within the array as described above in FIGS. 2e and 3d.

A color filter is placed (Box 680) over the array of multiple photosensor pixel image sensors. The color filter array is arranged on the surface of the substrate and superimposed upon the array of multiple photosensor pixel image sensor. The color filter array is formed by arranging color filtering regions to differentiate light impinging upon the multiple photosensor pixel image sensor into at least one color hue. The color filtering regions are tinted with the color hues to filter the light. The color hues are generally, but not restricted to yellow/magenta, yellow/blue, magenta/cyan, transparent/red. The color filter regions are arranged such that the multiple photosensor pixel image sensor and the color filter array generate image data matching a pixel color arrangement of a display.

The sensitivities for each photo-sensing device of the multiple photosensor pixel image sensors are shown as Red-Green, Green-Blue, and Red-Green-Blue (essentially White Light). However, it is envisioned that other color sensitivities such as Red-Blue are possible with appropriate device construction. Further, color combinations other than those described are possible to provide the necessary pixel image data structure to match a display.

While this invention has been particularly shown and described with reference to the preferred embodiments thereof, it will be understood by those skilled in the art that various changes in form and details may be made without departing from the spirit and scope of the invention. departing from the spirit and scope of the invention.

The invention claimed is:

1. A multiple photosensor pixel image sensor fabricated on a surface of a substrate for sensing differentiated color components of light impinging upon said multiple photosensor pixel image sensor, said multiple photosensor pixel image sensor comprising:
    a plurality of photo-sensing devices formed within said surface of said substrate, each photo-sensing device having a structure adjusted to convert photons of said light to photoelectrons representative of a magnitude of said color components of said light for which said structure of said photo-sensing device is adjusted and those of said plurality of photo-sensing devices that sense a first color component and a second color component of said light are formed in a first deep diffusion well implanted with impurities of a first conductivity type for separation of the first color component of light from the second color component of light; and
    at least one storage node formed within said surface of said substrate and connected to selectively receive photoelectrons from multiple photo-sensing devices of said plurality of photo-sensing devices.

2. The multiple photosensor pixel image sensor of claim 1 wherein said color components are red, green, and blue; red and green; green and blue; or red and blue.

3. The multiple photosensor pixel image sensor of claim 1 wherein the first color component is a blue color component and the second color component is a green color component.

4. The multiple photosensor pixel image sensor of claim 3 wherein said impurities of the first conductivity type are P-type impurities.

5. The multiple photosensor pixel image sensor of claim 1 wherein said photo-sensing devices that said first color component and said second color component comprise a diffusion of a second conductivity type to create a junction within said first deep diffusion for conversion of said photons to photoelectrons.

6. The multiple photosensor pixel image sensor of claim 5 wherein those of said plurality of photo-sensing devices that sense said second color component and a third color component of said light are formed in a second deep diffusion well implanted with impurities of a second conductivity type for separation of the second color component of light from the third color component of light.

7. The multiple photosensor pixel image sensor of claim 6 wherein said impurity of said second conductivity type is a an N-type impurity.

8. The multiple photosensor pixel image sensor of claim 3 wherein said photo-sensing devices sensing said green and blue color component are pinned photodiodes.

9. The multiple photosensor pixel image sensor of claim 8 wherein said pinned photodiodes comprise a diffusion of the second conductivity type within said deep diffusion of the first conductivity type and a shallow pinning diffusion of the first conductivity type within said diffusion of the second conductivity type and connected to a ground reference level.

10. The multiple photosensor pixel image sensor of claim 2 wherein those photo-sensing devices sensing said red, green, and blue color component are photodiodes formed within an epitaxial layer of said substrate.

11. The multiple photosensor pixel image sensor of claim 2 wherein those photo-sensing devices sensing said red, green, and blue color component are pinned photodiodes formed within an epitaxial layer of said substrate.

12. The multiple photosensor pixel image sensor of claim 11 wherein said pinned photodiodes comprise a diffusion of the first conductivity type within said epitaxial layer and a shallow pinning diffusion of the second conductivity type within said diffusion of the first conductivity type and connected to a ground reference level.

13. The multiple photosensor pixel image sensor of claim 1 further comprising at least one readout circuit connected to receive and convert photoelectrons retained by at least one storage node for conversion to an electronic signal indicative of a magnitude of said color component of said light received by one selected photo-sensing device.

14. The multiple photosensor pixel image sensor of claim 13 wherein said readout circuit further comprises:
    a source follower connected to said storage node to receive and buffer a voltage indicative of a number of photoelectrons retained at said storage node; and
    a pixel select switch selectively connected to said source follower to transfer said buffered voltage indicative of the number of photoelectrons at said storage node to external circuitry for further processing.

15. The multiple photosensor pixel image sensor of claim 1 further comprising:
    a plurality of triggering switches, each triggering switch connected between one of said plurality of photo-sensing devices and one of said storage nodes to selectively and sequentially transfer said photoelectrons from each of the plurality of photo-sensing devices to said storage node; and
    at least one reset triggering switch in communication with said one of said storage nodes and those of said triggering switches connected to said one storage node to place said storage node to a reset voltage level after integration and sensing of said photoelectrons.

16. The multiple photosensor pixel image sensor of claim 6 wherein said photo-sensing devices that sense said second color component and said third color component comprise a diffusion of a first conductivity type to create a junction within said second deep diffusion for conversion of said photons to photoelectrons.

17. A pixel image sensor integrated circuit fabricated on a substrate comprising:

an array of multiple photosensor pixel image sensors for sensing differentiated color components of light impinging upon said multiple photosensor pixel image sensor, said multiple photosensor pixel image sensor comprising:
   a plurality of photo-sensing devices formed within said surface of said substrate, each photo-sensing device having a structure adjusted to convert photons of said light to photoelectrons representative of a magnitude of said color components of said light for which said structure of said photo-sensing device is adjusted and those of said plurality of photo-sensing devices that sense a first color component and a second color component of said light are formed in a first deep diffusion well implanted with impurities of a first conductivity type for separation of the first color component of light from the second color component of light; and
   at least one storage node formed within said surface of said substrate and connected to selectively receive photoelectrons from multiple photo-sensing devices each of said plurality of photo-sensing devices.

18. The pixel image sensor integrated circuit of claim 17 wherein said color components are red, green, and blue; red and green; green and blue; or red and blue.

19. The pixel image sensor integrated circuit of claim 17 wherein the first color component is a blue color component and the second color component is a green color component.

20. The pixel image sensor integrated circuit of claim 19 wherein said impurities of the first conductivity type are P-type impurities.

21. The pixel image sensor integrated circuit of claim 17 wherein said photo-sensing devices that said first color component and said second color component comprise a diffusion of a second conductivity type to create a junction within said first deep diffusion for conversion of said photons to photoelectrons.

22. The pixel image sensor integrated circuit of claim 21 wherein those of said plurality of photo-sensing devices that sense said second color component and a third color component of said light are formed in a second deep diffusion well implanted with impurities of a second conductivity type for separation of the second color component of light from the third color component of light.

23. The pixel image sensor integrated circuit of claim 22 wherein said impurity of said second conductivity type is a an N-type impurity.

24. The pixel image sensor integrated circuit of claim 19 wherein said photo-sensing devices sensing said green and blue color component are pinned photodiodes.

25. The pixel image sensor integrated circuit of claim 24 wherein said pinned photodiodes comprise a diffusion of the second conductivity type within said first deep diffusion of the first conductivity type and a shallow pinning diffusion of the first conductivity type within said diffusion of the second conductivity type and connected to a ground reference level.

26. The pixel image sensor integrated circuit of claim 18 wherein those photo-sensing devices sensing said red, green, and blue color component are photodiodes formed within an epitaxial layer of said substrate.

27. The pixel image sensor integrated circuit of claim 18 wherein those photo-sensing devices sensing said red, green, and blue color component are pinned photodiodes formed within an epitaxial layer of said substrate.

28. The pixel image sensor integrated circuit of claim 27 wherein said pinned photodiodes comprise a diffusion of the first conductivity type within said epitaxial layer and a shallow pinning diffusion of the second conductivity type within said diffusion of the first conductivity type and connected to a ground reference level.

29. The pixel image sensor integrated circuit of claim 17 wherein each multiple photosensor pixel image sensor of the array of multiple photosensor pixel image sensors further comprises at least one readout circuit connected to receive and convert photoelectrons retained by at least one storage node for conversion to an electronic signal indicative of a magnitude of said color component of said light received by one selected photo-sensing device.

30. The pixel image sensor integrated circuit of claim 29 wherein said readout circuit further comprises:
   a source follower connected to said storage node to receive and buffer a voltage indicative of a number of photoelectrons retained at said storage node; and
   a pixel select switch selectively connected to said source follower to transfer said buffered voltage indicative of the number of photoelectrons at said storage node to external circuitry for further processing.

31. The pixel image sensor integrated circuit of claim 17 further comprising a color filter array arranged on the surface of said substrate and superimposed upon said array of multiple photosensor pixel image sensor, said color filter array comprising a plurality of color filtering regions to differentiate light impinging upon said multiple photosensor pixel image sensor into at least one color hue.

32. The pixel image sensor integrated circuit of claim 31 wherein said color filtering regions are tinted to filter said light to said color hues, said color hues being selected from the group of color hues consisting of yellow/magenta, yellow/blue, magenta/cyan, and transparent/red.

33. The pixel image sensor integrated circuit of claim 32 wherein said color filtering regions are arranged such that said multiple photosensor pixel image sensor and said color filter array generate image data matching a pixel color arrangement of a display.

34. The pixel image sensor integrated circuit of claim 17 wherein the multiple photosensor pixel image sensor further comprises:
   a plurality of triggering switches, each triggering switch connected between one of said plurality of photo-sensing devices and one of said storage nodes to selectively and sequentially transfer said photoelectrons from each of the plurality of photo-sensing devices to said storage node; and
   at least one reset triggering switch in communication with said one of said storage nodes and those of said triggering switches connected to said one storage node to place said storage node to a reset voltage level after integration and sensing of said photoelectrons.

35. The pixel image sensor integrated circuit of claim 17 wherein said photo-sensing devices that sense said second color component and said third color component comprise a diffusion of a first conductivity type to create a junction within said second deep diffusion for conversion of said photons to photoelectrons.

36. An image capture system for sensing light to generate digital image data having a pixel format of a display device, comprising:
   a pixel image sensor integrated circuit fabricated on a substrate comprising:
      an array of multiple photosensor pixel image sensors for sensing differentiated color components of light impinging upon said multiple photosensor pixel image sensor, said multiple photosensor pixel image sensor comprising:

a plurality of photo-sensing devices formed within said surface of said substrate, each photo-sensing device having a structure adjusted to convert photons of said light to photoelectrons representative of a magnitude of said color components of said light for which said structure of said photo-sensing device is adjusted and those of said plurality of photo-sensing devices that sense a first color component and a second color component of said light are formed in a first deep diffusion well implanted with impurities of a first conductivity type for separation of the first color component of light from the second color component of light; and at least one storage node formed within said surface of said substrate and connected to selectively receive photoelectrons from multiple photo-sensing devices of said plurality of photo-sensing devices.

37. The image capture system of claim 36 wherein said color components are red, green, and blue; red and green; green and blue; or red and blue.

38. The image capture system of claim 36 wherein the first color component is a blue color component and the second color component is a green color component.

39. The image capture system of claim 38 wherein said impurities of the first conductivity type are P-type impurities.

40. The image capture system of claim 36 wherein said photo-sensing devices that sense said first color component and said second color component comprise a diffusion of a second conductivity type to create a junction within said first deep diffusion for conversion of said photons to photoelectrons.

41. The image capture system of claim 40 wherein those of said plurality of photo-sensing devices that sense said second color component and a third color component of said light are formed in a second deep diffusion well implanted with impurities of a second conductivity type for separation of the second color component of light from the third color component of light.

42. The image capture system of claim 41 wherein said impurity of said second conductivity type is a an N-type impurity.

43. The image capture system of claim 38 wherein said photo-sensing devices sensing said green and blue color component are pinned photodiodes.

44. The image capture system of claim 43 wherein said pinned photodiodes comprise a diffusion of the second conductivity type within said first deep diffusion of the first conductivity type and a shallow pinning diffusion of the first conductivity type within said diffusion of the second conductivity type and connected to a ground reference level.

45. The image capture system of claim 37 wherein those photo-sensing devices sensing said red, green, and blue color component are photodiodes formed within an epitaxial layer of said substrate.

46. The image capture system of claim 37 wherein those photo-sensing devices sensing said red, green, and blue color component are pinned photodiodes formed within an epitaxial layer of said substrate.

47. The image capture system of claim 46 wherein said pinned photodiodes comprise a diffusion of the first conductivity type within said epitaxial layer and a shallow pinning diffusion of the second conductivity type within said diffusion of the first conductivity type and connected to a ground reference level.

48. The image capture system of claim 36 wherein each multiple photosensor pixel image sensor of the array of multiple photosensor pixel image sensors further comprises at least one readout circuit connected to receive and convert photoelectrons retained by at least one storage node for conversion to an electronic signal indicative of a magnitude of said color component of said light received by one selected photo-sensing device.

49. The image capture system of claim 48 wherein said readout circuit further comprises:

a source follower connected to said storage node to receive and buffer a voltage indicative of a number of photoelectrons retained at said storage node; and a pixel select switch selectively connected to said source follower to transfer said buffered voltage indicative of the number of photoelectrons at said storage node to external circuitry for further processing.

50. The image capture system of claim 36 wherein each pixel image sensor integrated circuit further comprises a color filter array arranged on the surface of said substrate and superimposed upon said array of multiple photosensor pixel image sensor, said color filter array comprising a plurality of color filtering regions to differentiate light impinging upon said multiple photosensor pixel image sensor into at least one color hue.

51. The image capture system of claim 50 wherein said color filtering regions are tinted to filter said light to said color hues, said color hues being selected from the group of color hues consisting of yellow/magenta, yellow/blue, magenta/cyan, transparent/red.

52. The image capture system of claim 51 wherein said color filtering regions are arranged such that said multiple photosensor pixel image sensor and said color filter array generate image data matching a pixel color arrangement of a display.

53. A method for fabricating a pixel image sensor integrated circuit on a substrate comprising the steps of:

forming an array of multiple photosensor pixel image sensors for sensing differentiated color components of light impinging upon said multiple photosensor pixel image sensor, forming said multiple photosensor pixel image sensor comprising the steps of:

forming a first deep diffusion well implanted with impurities of a first conductivity type in the substrate;

forming a first plurality of photo-sensing devices within said first deep diffusion for separation of a first color component of light from a second color component of light; by the step of:

adjusting a structure of each photo-sensing device to convert photons of said light to photoelectrons representative of a magnitude of at least said first color component and said second color component of said light for which said structure of said photo-sensing device is adjusted;

forming a second plurality of photosensing devices within said surface of said substrate by the step of:

adjusting a structure of each photo-sensing device to convert photons of said light to photoelectrons representative of a magnitude of at least said second color component of said light for which said structure of said photo-sensing device is adjusted;

forming at least one storage node within said surface of said and connected to selectively receive photoelectrons from multiple photo-sensing devices of said plurality of photo-sensing devices.

54. The method for forming said pixel image sensor integrated circuit of claim 53 wherein said color components are of red, green, and blue; red and green; green and blue; or red and blue.

55. The method for forming said pixel image sensor integrated circuit of claim 53 wherein forming those of said plurality of photo-sensing devices that sense the first color component is a blue color component and the second color component is a green color component.

56. The method for forming said pixel image sensor integrated circuit of claim 55 wherein said impurities of the first conductivity type are P-type impurities.

57. The method for forming said pixel image sensor integrated circuit of claim 54 wherein forming said photo-sensing devices that sense said first color component and said second color component comprise the step of implanting a diffusion of a second conductivity type to create a junction within first said deep diffusion for conversion of said photons to photoelectrons.

58. The method for forming said pixel image sensor integrated circuit of claim 57 wherein forming those of said plurality of photo-sensing devices that sense said second color component and a third color component comprise the step of implanting impurities of a second conductivity type to form a second deep diffusion well for separation of the second color component of light from the third color component of light.

59. The method for forming said pixel image sensor integrated circuit of claim 58 wherein said impurity of said second conductivity type is an N-type impurity.

60. The method for forming said pixel image sensor integrated circuit of claim 54 wherein said photo-sensing devices sensing said green and blue color component are pinned photodiodes.

61. The method for forming said pixel image sensor integrated circuit of claim 60 wherein forming said pinned photodiodes comprise the steps of:
    implanting a diffusion of the first conductivity type within said first deep diffusion of the second conductivity type;
    implanting a shallow pinning diffusion of the second conductivity type within said first deep diffusion of the first conductivity type; and
    connecting said shallow pinning diffusion to a ground reference level.

62. The method for forming said pixel image sensor integrated circuit of claim 54 wherein forming those photo-sensing devices sensing said red, green, and blue color component includes the step of forming photodiodes within an epitaxial layer of said substrate.

63. The method for forming said pixel image sensor integrated circuit of claim 54 wherein forming those photo-sensing devices sensing said red, green, and blue color component includes the step of forming pinned photodiodes within an epitaxial layer of said substrate.

64. The method for forming said pixel image sensor integrated circuit of claim 63 wherein forming said pinned photodiodes comprise the steps of:
    implanting a diffusion of the first conductivity type within said epitaxial layer;
    implanting a shallow pinning diffusion of the second conductivity type within said diffusion of the first conductivity type; and
    connecting said shallow pinning diffusion to a ground reference level.

65. The method for forming said pixel image sensor integrated circuit of claim 53 wherein forming each multiple photosensor pixel image sensor of the array of multiple photosensor pixel image sensors further comprises the steps of:
    forming at least one readout circuit;
    connecting said readout circuit to receive and convert photoelectrons retained by at least one storage node for conversion to an electronic signal indicative of a magnitude of said color component of said light received by one selected photo-sensing device.

66. The method for forming said pixel image sensor integrated circuit of claim 65 wherein forming said readout circuit further comprises the steps of:
    forming a source follower;
    connecting said source follower to said storage node to receive and buffer a voltage indicative of a number of photoelectrons retained at said storage node;
    forming a pixel select switch;
    selectively connecting said pixel select switch to said source follower to transfer said buffered voltage indicative of the number of photoelectrons at said storage node to external circuitry for further processing.

67. The method for forming said pixel image sensor integrated circuit of claim 53 further comprising the step of forming a color filter array arranged on the surface of said substrate and superimposed upon said array of multiple photosensor pixel image sensor, said color filter array formed by the step of forming a plurality of color filtering regions to differentiate light impinging upon said multiple photosensor pixel image sensor into at least one color hue.

68. The method for forming said pixel image sensor integrated circuit of claim 67 wherein forming said color filtering regions comprises the step of tinting said color filtering regions with said color hues to filter said light, said color hues being selected from the group of color hues consisting of yellow/magenta, yellow/blue, magenta/cyan, transparent/red.

69. The method for forming said pixel image sensor integrated circuit of claim 68 wherein forming said color filtering regions further comprising arranging said color filtering regions such that said multiple photosensor pixel image sensor and said color filter array generate image data matching a pixel color arrangement of a display.

70. The method for forming said pixel image sensor integrated circuit of claim 53 further comprising the steps of:
    forming a plurality of triggering switches, each triggering switch connected between one of said plurality of photo-sensing devices and one of said storage nodes to selectively and sequentially transfer said photoelectrons from each of the plurality of photo-sensing devices to said storage node; and
    forming at least one reset triggering switch in communication with said one of said storage nodes and those of said triggering switches connected to said one storage node to place said storage node to a reset voltage level after integration and sensing of said photoelectrons.

71. The method for forming said pixel image sensor integrated circuit of claim 58 wherein the step of forming a second plurality of photo-sensing devices that sense said second color component and said third color component comprise the step of implanting a diffusion of a first conductivity type to create a junction within said second deep diffusion for conversion of said photons to photoelectrons.

* * * * *